(12) United States Patent
Chen et al.

(10) Patent No.: US 10,582,616 B1
(45) Date of Patent: Mar. 3, 2020

(54) UNIFORMLY EMITTING LINEAR LED LIGHT SOURCE ASSEMBLY AND METHOD

(71) Applicant: EXCELLENCE OPTOELECTRONICS INC., Hsinchu Science Park (TW)

(72) Inventors: Yen-Cheng Chen, Miaoli County (TW); Tse-Wei Chiu, Miaoli County (TW); Cheng-Tai Jao, Miaoli County (TW)

(73) Assignee: EXCELLENCE OPTOELECTRONICS INC., Hsinchu Science Park (TW)

( * ) Notice: Subject to any disclaimer, the term of this patent is extended or adjusted under 35 U.S.C. 154(b) by 0 days.

(21) Appl. No.: 16/222,809

(22) Filed: Dec. 17, 2018

(30) Foreign Application Priority Data

Oct. 12, 2018 (TW) .............................. 107136003 A

(51) Int. Cl.
| | |
|---|---|
| *H05K 1/00* | (2006.01) |
| *H05K 1/18* | (2006.01) |
| *H05K 7/00* | (2006.01) |
| *H05K 1/14* | (2006.01) |
| *H01L 25/075* | (2006.01) |
| *H01L 23/538* | (2006.01) |

(Continued)

(52) U.S. Cl.
CPC ........... *H05K 1/144* (2013.01); *F21V 19/001* (2013.01); *H01L 23/5387* (2013.01); *H01L 25/0753* (2013.01); *H01L 33/62* (2013.01); *H05K 1/028* (2013.01); *H05K 1/09* (2013.01); *H05K 1/115* (2013.01); *F21Y 2103/10* (2016.08); *F21Y 2115/10* (2016.08); *H05K 2201/041* (2013.01); *H05K 2201/10106* (2013.01)

(58) Field of Classification Search
CPC . F21K 9/27; F21K 9/278; F21V 31/04; F21Y 2103/10; F21Y 2115/10
USPC ............................ 361/748; 257/88; 362/240
See application file for complete search history.

(56) References Cited

U.S. PATENT DOCUMENTS

| | | | |
|---|---|---|---|
| 6,283,612 B1 | 9/2001 | Hunter | |
| 6,394,623 B1 | 5/2002 | Tsui | |

(Continued)

FOREIGN PATENT DOCUMENTS

| | | |
|---|---|---|
| CN | 202056797 U | 11/2011 |
| CN | 202629944 U | 12/2012 |

(Continued)

*Primary Examiner* — Yuriy Semenenko
(74) *Attorney, Agent, or Firm* — Procopio, Cory, Hargreaves & Savitch LLP

(57) ABSTRACT

Disclosed are a uniformly emitting linear LED light source assembly and a method thereof. The linear LED light source assembly comprises a first light strip, at least one second light strip and at least one connecting board which are all provided with a plurality of LEDs closely arranged at equal intervals, wherein the equal interval is less than 3.5 mm to realize uniform illumination. The connecting board connects the first light strip and the second light strip. The LED closest to the first light strip on the connecting board and the LED closest to the connecting board on the first light strip are formed at the same pitch as the equal interval. In addition, the LED closest to the second light bar on the connecting board and the LED closest to the connecting board on the second light bar are formed at the same pitch as the equal interval.

17 Claims, 17 Drawing Sheets

(51) Int. Cl.
   *H01L 33/62* (2010.01)
   *H05K 1/09* (2006.01)
   *H05K 1/02* (2006.01)
   *F21V 19/00* (2006.01)
   *H05K 1/11* (2006.01)
   *F21Y 103/10* (2016.01)
   *F21Y 115/10* (2016.01)

(56) References Cited

U.S. PATENT DOCUMENTS

| | | | |
|---|---|---|---|
| 6,860,007 B1 | 3/2005 | Liu et al. | |
| 7,097,479 B2 | 8/2006 | Lee | |
| 7,936,415 B2* | 5/2011 | Park | G02F 1/133603 349/57 |
| 8,764,220 B2* | 7/2014 | Chan | F21V 15/013 362/217.02 |
| 9,082,947 B2* | 7/2015 | Rhee | H01L 27/156 |
| 2001/0030860 A1* | 10/2001 | Kimura | G02B 6/0028 362/620 |
| 2002/0191393 A1* | 12/2002 | Chen | F21V 25/04 362/227 |
| 2005/0265051 A1* | 12/2005 | Yamamoto | F21S 2/005 362/657 |
| 2011/0199768 A1* | 8/2011 | Kuo | F21V 31/04 362/249.02 |
| 2019/0063694 A1* | 2/2019 | Kang | G02B 3/00 |
| 2019/0299531 A1* | 10/2019 | Park | B29C 64/129 |

FOREIGN PATENT DOCUMENTS

| | | |
|---|---|---|
| CN | 203562541 U | 4/2014 |
| CN | 203596430 U | 5/2014 |
| CN | 105684069 A | 6/2016 |
| TW | M311979 U | 5/2007 |
| TW | 200812054 A | 3/2008 |

\* cited by examiner

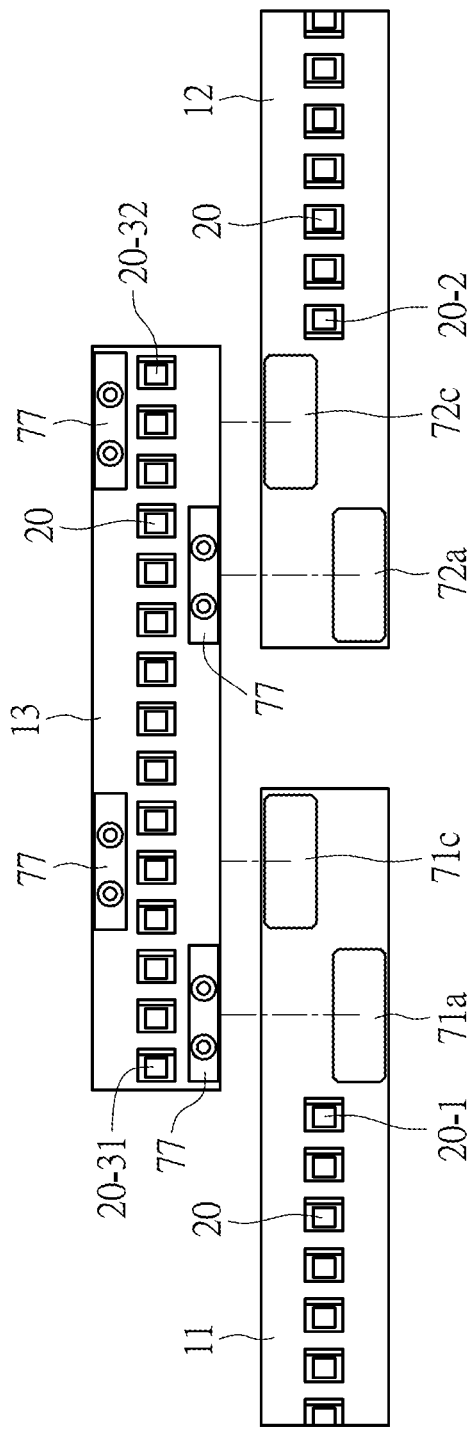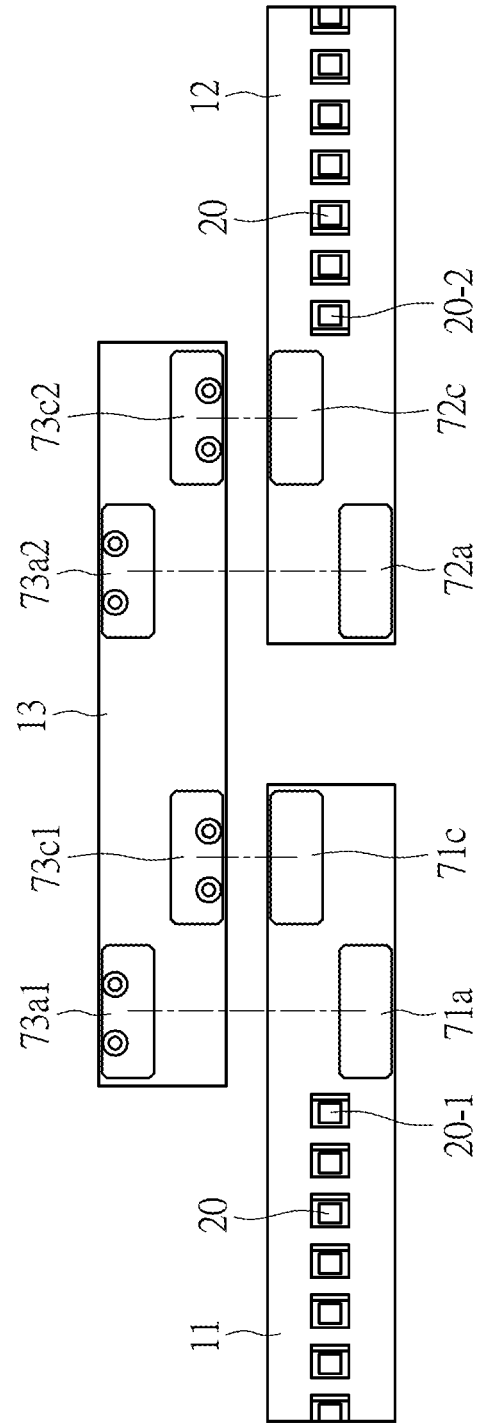

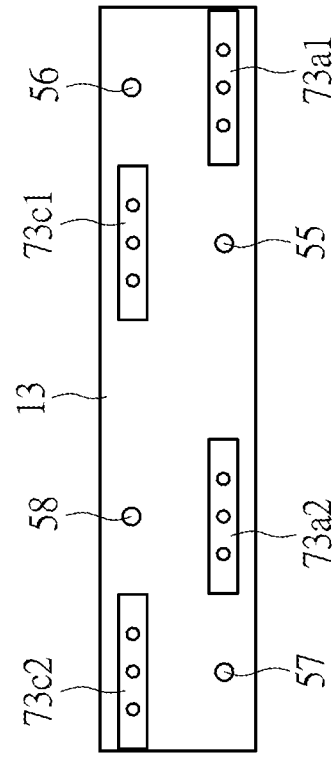
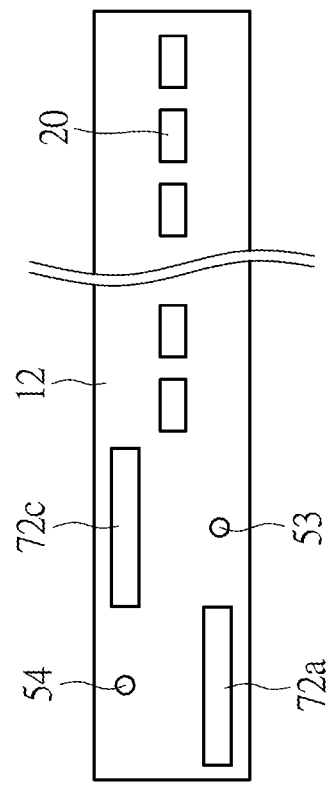
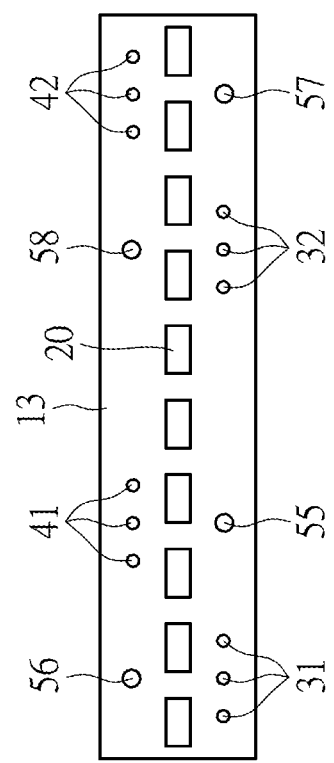
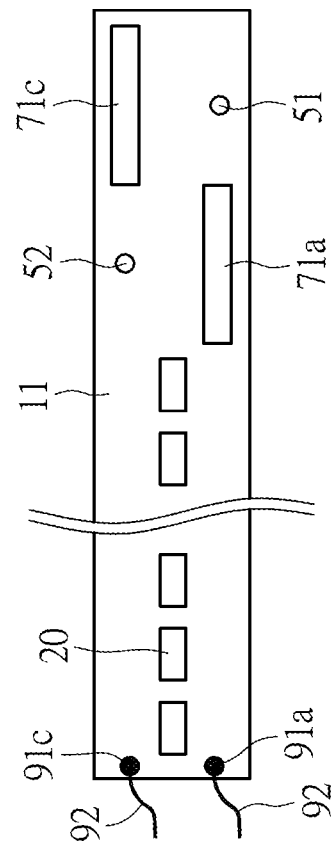
FIG. 4A
FIG. 4B
FIG. 4C

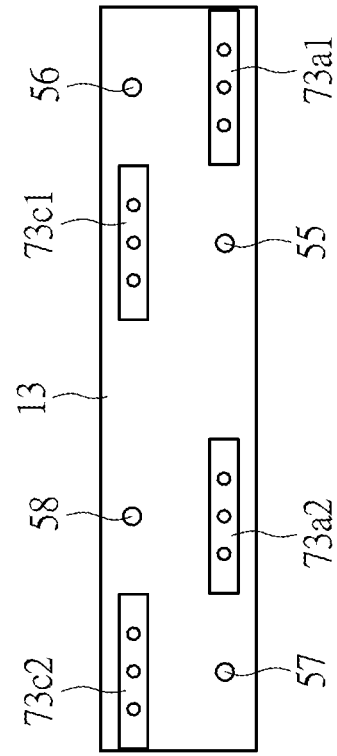
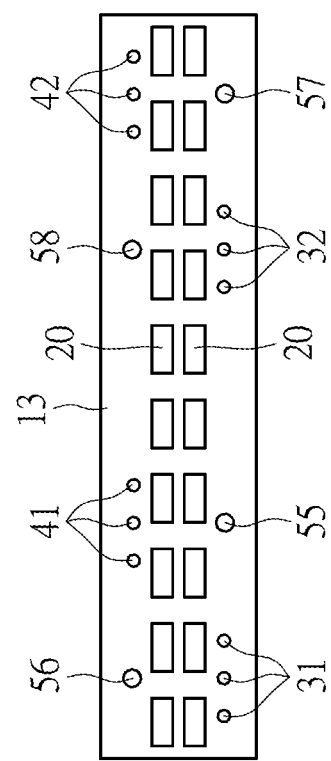
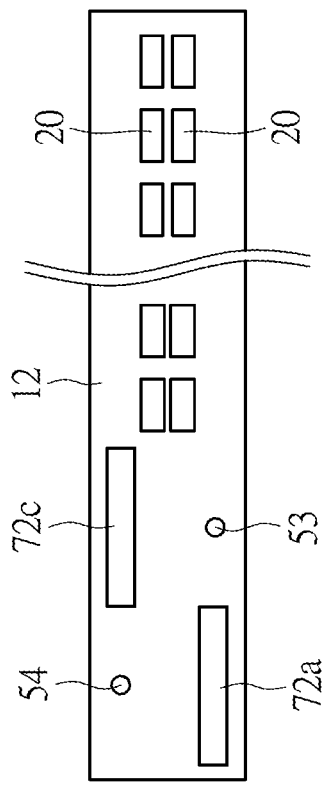
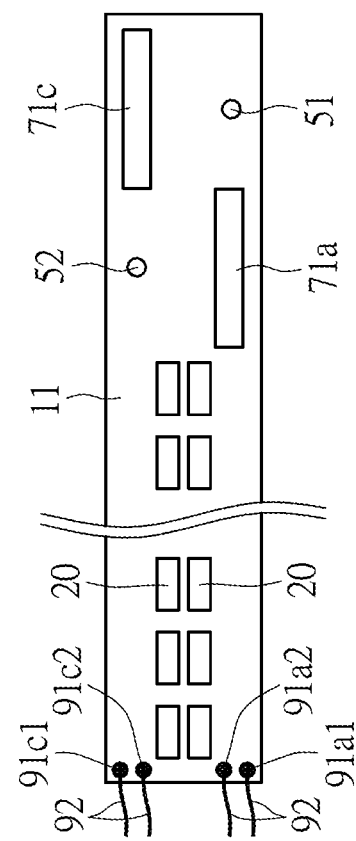
FIG. 5B
FIG. 5C
FIG. 5A

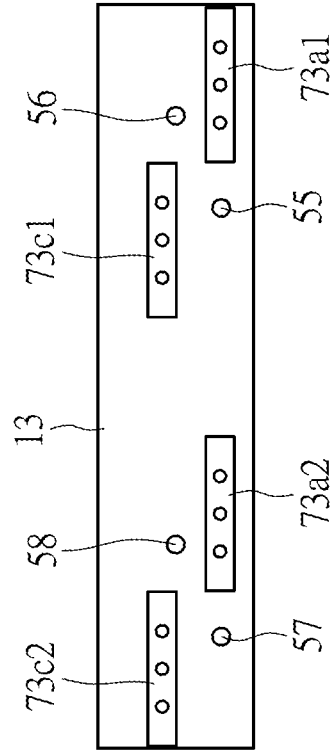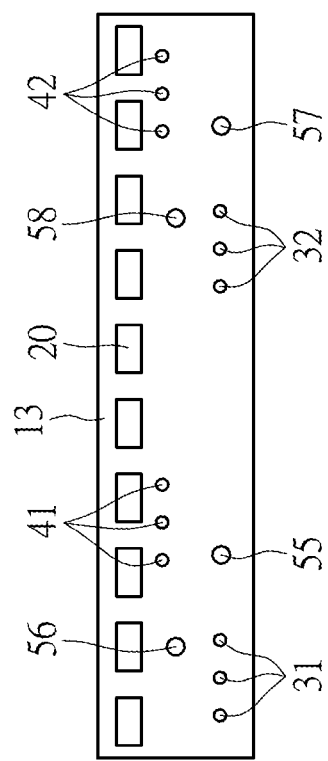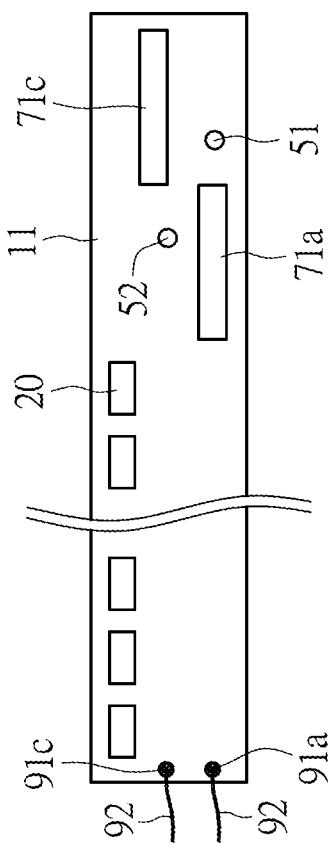
FIG. 6A
FIG. 6B
FIG. 6C

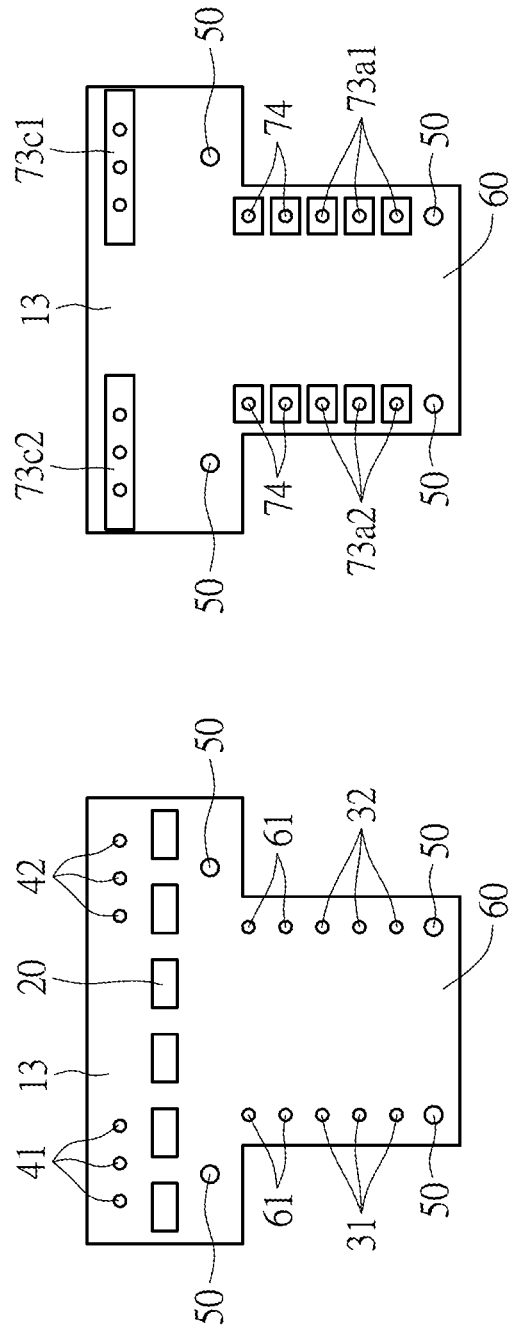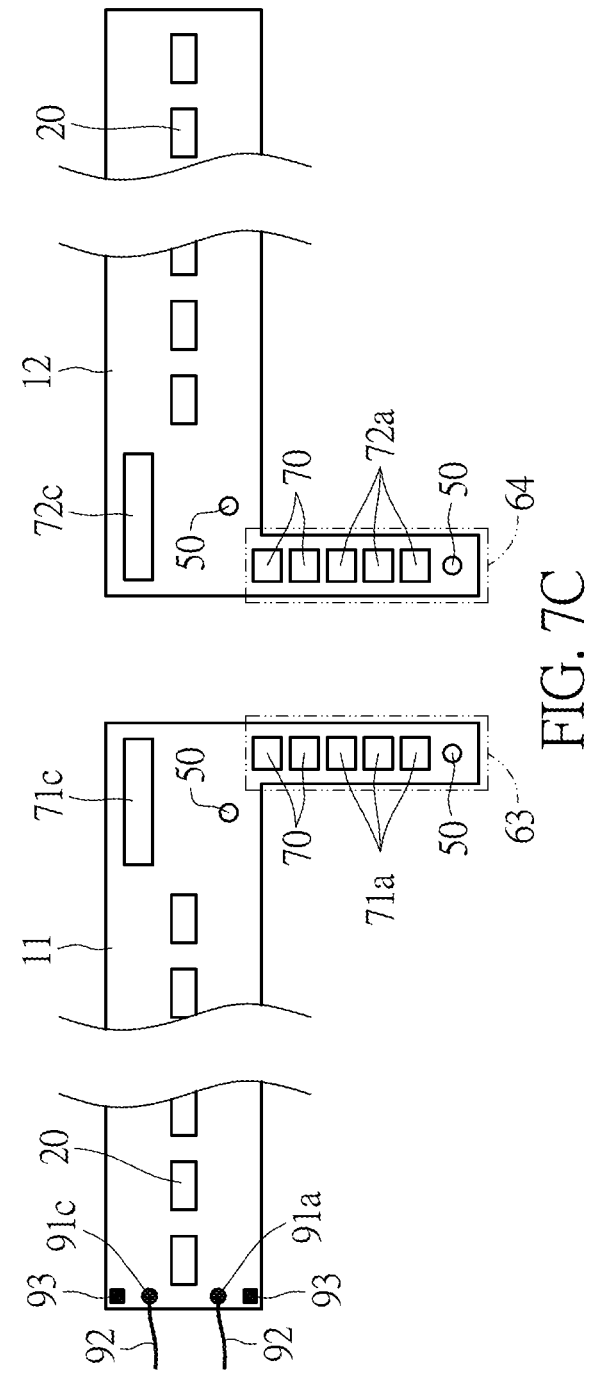

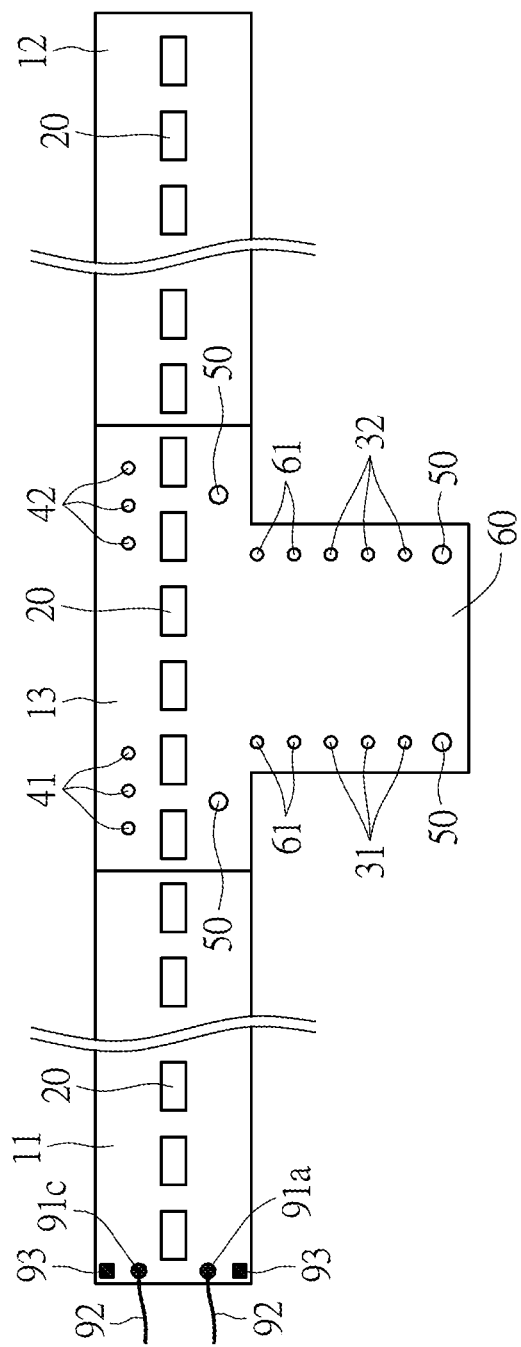
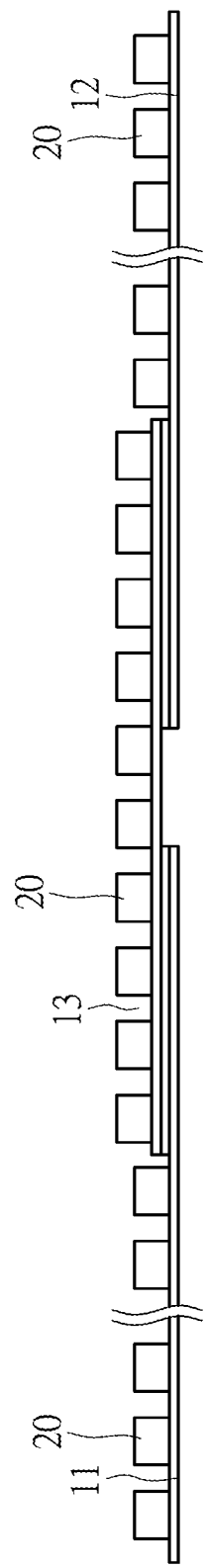
FIG. 7D
FIG. 7E

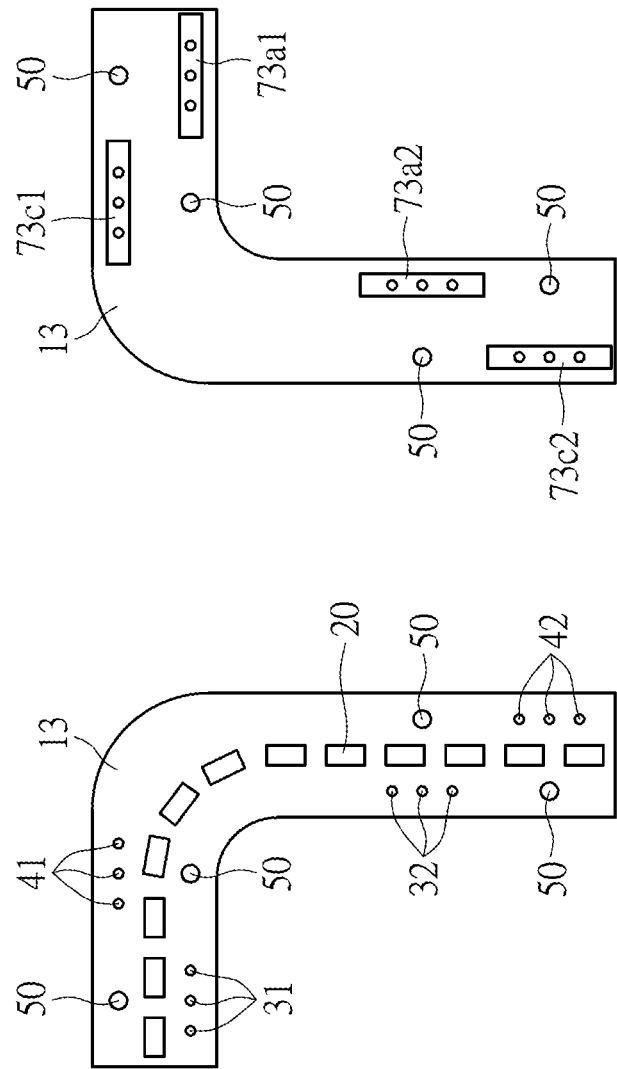
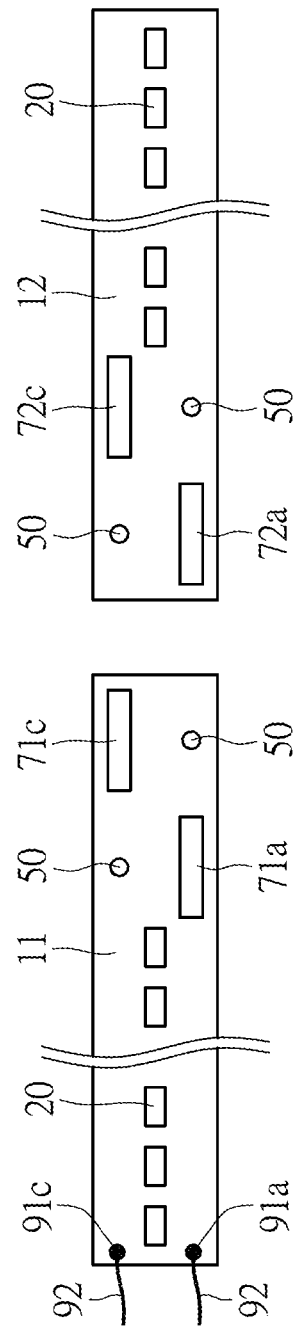
FIG. 8A
FIG. 8B
FIG. 8C

UNIFORMLY EMITTING LINEAR LED LIGHT SOURCE ASSEMBLY AND METHOD

BACKGROUND OF THE INVENTION

1. Field of the Invention

The present invention relates to a uniformly emitting linear light emitting diode (LED) light source assembly and a method thereof, and in particular, to a uniformly emitting linear LED light source assembly which can realize uniform illumination and can be lengthened according to usage requirements, and a method thereof.

2. Description of Related Art

In the LED-related lighting technology, because LEDs are energy efficient and can emit light of different colors, they have been widely applied to various fields which require illumination. Accordingly, the geometric structure of an LED light source or an LED lamp is evolved from an original point light source, to a linear light source, a surface light source or even a stereo light source according to requirements in design and usage. Thus, the LED light source is applied to almost everywhere, such as from household appliances to 3C products, display, illumination, automotive lighting, and other fields. In addition, a uniformly emitting light source with high luminous efficacy has been principally developed in recent years among various light sources. For example, due to uniform luminosity, a surface light source made by using an organic light-emitting diode (OLED) has become a new light source applied to indoor lighting and automobile tail lamps. Although LEDs are point light sources, if multiple small LEDs are closely and regularly arranged at reduced intervals, uniform illumination of LED light source can also be realized. For example, a matrix-shaped light source made by closely arranging multiple mini LEDs can also have uniform illumination characteristic of a surface light source. The matrix LED light source has higher luminosity than the OLED, and can further be dynamically turned on or dimmed in sections. In actual applications, it is used as a backlight in liquid crystal displays (LCDs) to greatly enhance contrast between bright and dark of an LCD screen. The LEDs and the OLEDs are new light sources applied to automotive lighting. Limited by luminous efficiency and service life, the OLEDs can only be applied to red tail lamps and yellow turn signals of an automobile currently, and haven't yet been able to be applied to daytime running lamps (DRL) that need to be very bright and turned on for a long time during daytime. Therefore, it is required to develop an LED light source approaching the characteristics of the OLED, so as to realize uniform illumination and further gain advantages of long service life, high brightness, and dynamic variation of the LEDs. Such a light source is expected in the automobile and automotive lighting industries. Because a streamlined design is important to automobiles, a uniformly emitting linear LED light source made by closely arranging multiple and small LEDs in a line at equal intervals will become one of important light sources required in automotive lighting.

However, the existing LED linear light source is generally formed by arranging LED components on different Printed Circuit Boards (PCBs) by means of Surface Mounting Technology (SMT), and thus the length of this LED light source is inevitably limited within the maximum length of the conventional PCB in the market. Different product applications require light sources of different lengths. When a longer linear LED light source is required in actual use, a conventional method for lengthening an LED light strip is using a connector or board-to-board connection technology, to connect two or more LED light strips to lengthen the LED light strip.

However, neither of the conventional connector and the board-to-board connection technology, for example, connection using connectors, soldering using wire jumpers, and wiring and soldering using a flexible PCB (FPCB), can maintain uniform illumination of the lengthened linear light source due to a large connection area or lack of LED at connection area. Especially, as two linear LED light strips formed by closely arranged LEDs to achieve high illumination uniformity need to be connected, dark spots or dark regions always occur in the connected area. For example, the U.S. Pat. No. 6,283,612 discloses "LIGHT EMITTING DIODE LIGHT STRIP", wherein a disclosed LED light strip connection method is only applicable to a situation in which an interval between LEDs is greater than the size of a socket connector, otherwise the assembled LED light strip cannot maintain a uniform illumination effect after connection of the light strips.

The U.S. Pat. No. 6,394,623 discloses "TRANSLUCENT FLEXIBLE ROPE LIGHT AND METHODS OF FORMING AND USING SAME", wherein a disclosed LED light strip connection method uses an extra copper wire for connection, and the size of a dual-end connector is larger than an interval between LED components, thus failing to achieve a uniform illumination effect after connection of light strips.

The U.S. Pat. No. 6,860,007 discloses "METHOD OF PRODUCING AN LED ROPE LIGHT", where a metal wire is used to connect LED light seats of a device. The dimension of the light seat and the metal wire are several times longer than an LED component, resulting in that no LED exists or the interval between LEDs is excessively large in a joint, such that the LED light strip fails to achieve a uniform illumination effect after connection of light strips.

The U.S. Pat. No. 7,097,479 discloses "FPCB CONNECTION MECHANISM" and discloses a PCB connection method. Because the sizes of a connector and a cylindrical coaxial connector are several times larger than an LED component, the LED light strip cannot achieve a uniform illumination effect after connection of light strips.

The patent No. CN 203596430 U discloses "CONNECTOR OF FPCs AND PRINTED CIRCUIT BOARD", wherein a disclosed ZIF connector is several times larger than a common LED component, and thus the LED light strip cannot achieve a uniform illumination effect after connection of light strips.

The US patent No. US 2011/0199768 A1 discloses "ASSEMBLED LED LAMP STRIP STRUCTURE AND LED LAMP HAVING THE SAME FOR CONTINUOUS LIGHTING", wherein in a disclosed LED light strip connection method, an interval between LEDs at a joint is larger than an interval between regular LEDs in other regions, and thus the LED light strip cannot achieve a uniform illumination effect after connection of light strips.

The patent No. CN 202056797 U discloses "LED FLEXIBLE STRIP LAMP MULTIDIRECTIONAL CONNECTING PLATE". Because there is no LED component on a connecting board and the connecting board is only used for connection, LED light strip cannot achieve a uniform illumination effect after connection of light strips.

The patent No. CN 203562541 U discloses "LED LIGHT BAR CONNECTOR" and provides an LED light strip connection method. Because a connector is excessively large, LED light strip cannot achieve a uniform illumination effect after connection of light strips.

The patent No. CN 202629944 U discloses "LIGHT-EMITTING DIODE (LED) LAMP BAR CONNECTING DEVICE", wherein two LED light strips are connected by using a PCB fastening claw and a welding manner. Because it is difficult to reduce the PCB fastening device and the welding region in size, this connector is inapplicable to the connection of light strips on which LEDs need to be closely arranged to realize uniform illumination.

Therefore, none of the foregoing various conventional technologies is applicable to a linear LED light source assembly in which LEDs are closely arranged to realize uniform illumination. It is required to make an improvement thereto.

SUMMARY OF THE INVENTION

The present invention discloses a uniformly emitting linear LED light source assembly and a method thereof, and relates to a PCB-to-PCB connection technology, wherein LEDs are closely arranged on two or more PCBs. Moreover, uniformly emitting linear LED light bars or light strips can be connected together, to lengthen the LED light strip and maintain the uniform illumination characteristic. No dark spot or dark region occurs at a joint, and the bonding strength at the joint is highly ensured. Thus, by means of the present invention, an assembled LED light strip can be lengthened, and can still maintain a uniform illumination characteristic. The present invention is applicable to connection of LED light strips made of small LEDs with narrow LED interval for good illumination uniformity. In addition, the present invention is also applicable to manufacturing of a curved light strip or one of a complicated shape. Specifically, two or more straight light strips or ones of a simple shape are connected to form a curved light strip or one of a complicated shape, which can efficiently enhance the utilization of PCB materials required for manufacturing of light strips and greatly reduce the manufacturing costs.

The uniformly emitting linear LED light source assembly of the present invention includes a first light strip, at least one second light strip, and at least one connecting board. The first light strip is provided with a plurality of LEDs arranged at equal intervals and copper foil traces connected to an input power and LED anode and cathode leads on a common PCB. The LEDs are mounted through an SMT process and linearly arranged in one or multiple rows as required. The equal interval refers to an interval between closest sides of two adjacent LEDs, and is set to be less than 3.5 mm, so as to realize uniform illumination. The first light strip is provided with at least one positive contact and at least one negative contact for power input, which are used to connect with an external input power. The positive contact and the negative contact for power input may also be connected to a connector, so as to conveniently connect with the external input power. Thus, the LEDs on the first light strip can be turned on by using the external input power. At least one first positive polarity bonding zone is disposed at a side of the first light strip, and is connected to the positive contact for power input through the copper foil trace. At least one first negative polarity bonding zone is also disposed at a side of the first light strip, and is connected to the negative contact for power input through another copper foil trace. The second light strip is provided with a plurality of LEDs arranged at equal intervals and copper foil traces connected to an LED input power and LED positive and negative soldering pads on a common PCB. The LEDs are mounted through an SMT process. If there is no special requirement, the equal interval set for the second light strip is identical with that set for the first light strip. At least one second positive polarity bonding zone and at least one second negative polarity bonding zone are disposed at a side of the second light strip, where is to be connected to the first light strip or another second light strip. The connecting board is a PCB with two or more layers of copper foil. A front surface thereof is provided with a plurality of LEDs arranged at equal intervals and copper foil traces connected to an LED input power and LED positive and negative leads. The LEDs are mounted through an SMT process. The equal interval set for the connecting board is identical with that set for the first light strip. At least one third positive polarity bonding zone and at least one third negative polarity bonding zone are provided at a side where to be connected to the first light strip on the back surface of the connecting board. At least one electrical via hole is provided in each of the third positive polarity bonding zone and the third negative polarity bonding zone, so as to enable electric connection of circuits in the positive or negative polarity bonding zones of the connecting board on the front surface and the back surface of the PCB. The third positive polarity bonding zone on the connecting board and the first positive polarity bonding zone on the first light strip are electrically connected by conductive adhesive or by means of fusion soldering of metal with a low melting point, such that the third positive polarity bonding zone on the connecting board is electrically connected to the positive contact for power input on the first light strip through the first positive polarity bonding zone on the first light strip. The third negative polarity bonding zone on the connecting board and the first negative polarity bonding zone on the first light strip are electrically connected by conductive adhesive or by means of fusion soldering of metal with a low melting point, such that the third negative polarity bonding zone on the connecting board is electrically connected to the negative contact for power input on the first light strip through the first negative polarity bonding zone on the first light strip. In actual application, the external input power can transmit power to the connecting board through the first light strip, to turn on the LEDs on the connecting board. At least one fourth positive polarity bonding zone and at least one fourth negative polarity bonding zone are provided at a side where to be connected to the second light strip on the back surface of the connecting board. At least one electrical via hole is provided in each of the fourth positive polarity bonding zone and the fourth negative polarity bonding zone, so as to enable electric connection of circuits in the positive or negative polarity bonding zones of the connecting board on the front surface and the back surface of the PCB. The fourth positive polarity bonding zone on the connecting board and the second positive polarity bonding zone on the second light strip are electrically connected by conductive adhesive or by means of fusion soldering of metal with a low melting point, such that the second positive polarity bonding zone on the second light strip is electrically connected to the positive contact for power input on the first light strip through the fourth positive polarity bonding zone on the connecting board and the copper foil traces on the connecting board. The fourth negative polarity bonding zone on the connecting board and the second negative polarity bonding zone on the second light strip are electrically connected by conductive adhesive or by means of fusion soldering of metal with a low melting point, such that the second negative polarity bonding zone on the second light strip is electrically connected to the negative contact for power input on the first light strip through the fourth negative polarity bonding zone on the connecting board and the copper foil traces connected on the connecting board. Thus, the external input power supply can transmit power first to the connecting board and then to the second light strip through the first light strip, to turn on the LEDs on the second light strip. The connecting board, the first light strip and the second light strip are bonded by compression of the conductive adhesive or by means of fusion soldering of metal with a low melting point through a hot-bar process. In order to fix the relative positions of the connecting board, the first light strip and the second light strip, thus ensuring bonding accuracy and the interval between the LEDs, the first light strip and the second light strip are each provided with at least one positioning hole, and the connecting board is provided with at least two corresponding positioning holes. With these positioning holes, the leftmost LED on the front surface of the connecting board and the rightmost LED on the first light strip are easily kept at the same pitch as the equal interval set for the first light strip; and the rightmost LED on the front surface of the connecting board and the leftmost LED on the second light strip are easily kept at the same pitch as the equal interval set for the first light strip. By repeating the technology of the present invention, three or more LED light strips can be connected to lengthen the LED light strip and meet usage requirements. When the light strip can also be controlled by a control signal in addition to the external input power, the foregoing connection and transmission manner for the input power is also applicable to connection and transmission of the control signal.

A PCB used for the first light strip and the second light strip is a PCB with single-layer copper foil, which may be an FR4 PCB, an FPCB, or a Metal Core PCB (MCPCB). Alternatively, the PCB may also be a PCB with multi-layer copper foil, so as to improve a heat transfer effect or circuit wiring flexibility or electromagnetic compatibility (EMC). A PCB used for the connecting board is a PCB with double-layer copper foil. A thin PCB is preferred, which may be an FR4 PCB or FPCB. Alternatively, the PCB may also be a PCB with multi-layer copper foil, so as to improve a heat transfer effect or circuit wiring flexibility or electromagnetic compatibility (EMC).

BRIEF DESCRIPTION OF THE DRAWINGS

FIG. 1 is a schematic diagram of composition of a linear LED light source assembly according to an embodiment of the present invention;

FIG. 2 is a schematic diagram of a back surface of a connecting board (which is turned over from bottom to top) according to an embodiment of the present invention;

FIG. 4A is a schematic diagram of a front surface of a connecting board in a first embodiment of the present invention;

FIG. 4B is a schematic diagram of a back surface of the connecting board (which is turned over from left to right) in the first embodiment of the present invention;

FIG. 4C is a schematic diagram of front surfaces of a first light strip and a second light strip in the first embodiment of the present invention;

FIG. 5A is a schematic diagram of a front surface of a connecting board in a second embodiment of the present invention;

FIG. 5B is a schematic diagram of a back surface of the connecting board (which is turned over from left to right) in the second embodiment of the present invention;

FIG. 5C is a schematic diagram of front surfaces of a first light strip and a second light strip in the second embodiment of the present invention;

FIG. 6A is a schematic diagram of a front surface of a connecting board in a third embodiment of the present invention;

FIG. 6B is a schematic diagram of a back surface of the connecting board (which is turned over from left to right) in the third embodiment of the present invention;

FIG. 6C is a schematic diagram of front surfaces of a first light strip and a second light strip in the third embodiment of the present invention;

FIG. 7A is a schematic diagram of a front surface of a connecting board in a fourth embodiment of the present invention;

FIG. 7B is a schematic diagram of a back surface of the connecting board (which is turned over from left to right) in the fourth embodiment of the present invention;

FIG. 7C is a schematic diagram of front surfaces of a first light strip and a second light strip in the fourth embodiment of the present invention;

FIG. 7D is a schematic front view after assembly in the fourth embodiment of the present invention;

FIG. 7E is a schematic side view after assembly in the fourth embodiment of the present invention;

FIG. 8A is a schematic diagram of a front surface of a connecting board in a fifth embodiment of the present invention;

FIG. 8B is a schematic diagram of a back surface of the connecting board (which is turned over from left to right) in the fifth embodiment of the present invention;

FIG. 8C is a schematic diagram of front surfaces of a first light strip and a second light strip in the fifth embodiment of the present invention;

DETAILED DESCRIPTION OF THE PREFERRED EMBODIMENTS

Figure 3:
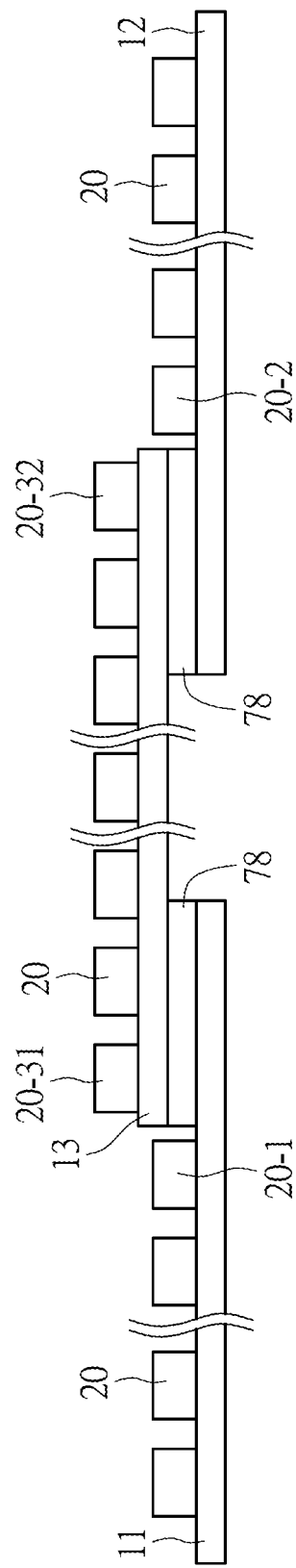
FIG. 3 is a schematic side view after assembly according to an embodiment of the present invention.

The present invention discloses a uniformly emitting linear LED light source assembly and a method thereof. Two or more LED light strips formed by closely arranged LEDs on PCBs to realize uniform illumination are connected by at least one special connecting board, such that the LED light strips are connected together to lengthen the connected LED light strip and maintain the uniform illumination characteristic. Moreover, no dark spot or dark region occurs at a joint area of the connected LED light strip, and the bonding strength at the joint is highly ensured. Because types and arrangements of the LEDs on the connecting board are consistent with those on the individual LED light strips, the assembled light strip can be lengthened, and further, can still maintain a uniform illumination characteristic according to the present invention.

Various exemplary embodiments are fully described below with reference to the accompanying drawings, and some of them are shown in the accompanying drawings. However, concept of the present invention may be embodied in many different forms and should not be construed as being limited to the illustrative embodiments set forth herein. Rather, these exemplary embodiments are provided so that the present invention can be detailed and specific, and the scope of the concept of the present invention can be fully conveyed to those skilled in the art. In the drawings, the sizes and corresponding positions of LEDs, circuit boards, bonding zones, holes, and the like, and a distance there between may be exaggerated for the sake of clarity. Similar English marks or numerals always denote similar or relevant components.

It should be noted that, the terms "first", "second", "third" and so on probably used in the specification are used to clearly distinguish one component from another component, but do not denote a particular sequence of the components. A mark 1b does not necessarily exist even if there are marks 1a and 1c (where the mark a used in the specification means the anode of an input power or an LED, while the mark c means the cathode of the input power or the LED). That is, numbers/numerals used to indicate circuit-related components do not necessarily have a numerically serial sequence to denote the component symbols.

The terms "left side" or "right side", "left end" or "right end", "left edge" or "right edge" and the like used in the specification are used to clearly distinguish one edge and endpoint of one component from another edge and endpoint of a corresponding component, or distinguish corresponding positions of one component and another component in connection, or denote that one edge and another edge are on different positions. These terms are not intended to limit a sequential relationship or positional relationship shown by the verbal numbers, and do not necessarily have a numerically serial sequence. Alternatively, viewed from another angle, the right side (or the left side) describing the component may be renamed the left side (or the right side), without affecting the essence of the technology. In addition, the specification may use the term "at least one" to describe one or more components used for implementation of the technology. The specification may also use the term "a plurality of" to show that there are multiple components, but the quantity is not limited to two, three, four or more in implementation of the technology.

Referring to FIG. 1 and FIG. 2, a uniformly emitting linear LED light source assembly of the present invention includes a first light strip 11, a second light strip 12 and a connecting board 13. The first light strip 11, the second light strip 12 and the connecting board 13 are all PCBs provided with a plurality of LEDs 20 closely arranged at equal intervals. The detailed description is made subsequently. First, a difference between FIG. 2 and FIG. 1 is that, FIG. 2 shows a back surface of the connecting board 13 in FIG. 1, where the structure shown in FIG. 2 is presented by turning over the connecting board 13 in FIG. 1 from bottom to top. That is, the connecting board 13 is turned upwards from its lower edge, and then the back surface of the connecting board 13 shown in FIG. 2 is presented. The first light strip 11 is a single-layer PCB; and is provided with a plurality of LEDs 20 arranged in a single row at equal intervals through an SMT process, copper foil traces (not shown in FIGS. 1 and 2) connected to LED positive and negative soldering pads, and a positive contact and a negative contact for power input (not shown in FIGS. 1 and 2). The positive contact and the negative contact are used to connect with an external input power, so as to turn on the LEDs on the first light strip by using the external input power. Each LED has the dimensions 3.5 mm×2.8 mm (commonly known as 3528 LED), and is mounted through the SMT process. The equal interval is less than the size of the LED in an arrangement direction, such that the LEDs realize uniform linear illumination after they are all turned on. A first positive polarity bonding zone 71a electrically connected to the positive contact for power input (this case is not shown in FIGS. 1 and 2) and a first negative polarity bonding zone 71c electrically connected to the negative contact for power input (this case is not shown in FIGS. 1 and 2) are provided at a side (for example, at the right side of the first light strip 11 in FIG. 1) of the first light strip 11. Likewise, the second light strip 12 is also provided with a plurality of LEDs 20 arranged at equal intervals and identical with those on the first light strip, and copper foil traces (not shown in FIGS. 1 and 2) electrically connected to the input power and LED positive and negative leads (not shown in FIGS. 1 and 2). The equal interval set for the second light strip 12 is identical with that set for the first light strip 11. A second positive polarity bonding zone 72a and a second negative polarity bonding zone 72c are provided at a side where to be connected with the first light strip 11 on the second light strip 12 (for example, at the left side of the second light strip 12 in FIG. 1).

The connecting board 13 in FIG. 1 is a PCB with double-layer copper foil, and its front surface is also provided with a plurality of LEDs 20 arranged in a single row at equal intervals through the SMT process. The equal interval set for the connecting board 13 is identical with that set for the first light strip 11. In FIG. 2, a third positive polarity bonding zone 73a1 and a third negative polarity bonding zone 73c1 are provided at a side corresponding to the first light strip 11 on the back surface of the connecting board 13 (which is turned over from bottom to top); and a fourth positive polarity bonding zone 73a2 and a fourth negative polarity bonding zone 73c2 are provided at a side corresponding to the second light strip 12 on the back surface of the connecting board 13. The third positive polarity bonding zone 73a1, the third negative polarity bonding zone 73c1, the fourth positive polarity bonding zone 73a2 and the fourth negative polarity bonding zone 73c2 are each provided with two electrical via holes which have copper plating along the hole's wall by means of a copper plating process. The electrical via hole may be a hollow hole or filled with metal or resin, and used to enable connection of corresponding circuits in the positive or negative polarity bonding zones on the front surface and the back surface of the connecting board 13. Conductive adhesive (not shown in FIGS. 1 and 2) is disposed on the third positive polarity bonding zone 73a1 and used to subsequently bond the third positive polarity bonding zone 73a1 and the first positive polarity bonding zone 71a of the first light strip 11. Conductive adhesive (not shown in FIGS. 1 and 2) is disposed on the third negative polarity bonding zone 73c1 and used to subsequently bond the third negative polarity bonding zone 73c1 and the first negative polarity bonding zone 71c of the first light strip 11. Conductive adhesive (not shown in FIGS. 1 and 2) is disposed on the fourth positive polarity bonding zone 73a2 and used to subsequently bond the fourth positive polarity bonding zone 73a2 and the second positive polarity bonding zone 72a of the second light strip 12. Conductive adhesive (not shown in FIGS. 1 and 2) is disposed on the fourth negative polarity bonding zone 73c2 and used to subsequently bond the fourth negative polarity bonding zone 73c2 and the second negative polarity bonding zone 72c of the second light strip 12. After assembly, the uniformly emitting linear LED light source assembly of the present invention is formed. In FIG. 1, four compression (thermo-compression) zones 77 are formed on the front surface of the connecting board 13, and their positions are respectively corresponding to the positions of the third positive polarity bonding zone 73a1, the third negative polarity bonding zone 73c1, the fourth positive polarity bonding zone 73a2 and the fourth negative polarity bonding zone 73c2 on the back surface of the connecting board 13. That is, in the embodiment shown in FIG. 1, four compression (thermo-compression) regions 77 are provided respectively corresponding to the different positive or negative polarity bonding zones on the back surface of the connecting board 13, to compress the conductive adhesive on the bonding zones in the assembly process. Thus, the positive or negative polarity bonding zones on the connecting board 13 are bonded with and electrically connected to the corresponding polarity bonding zones on the first light strip 11 and the second light strip 12 by the conductive adhesive. Consequently, from the positive and negative contacts (not shown in FIGS. 1 and 2) for power input on the first light strip 11, an external input power can transmit power to the connecting board 13 through the first light strip 11, and then to the second light strip 12 through the connecting board 13, to turn on the whole assembled light strip which still maintains the original characteristic of uniform illumination. In this embodiment, the equal intervals set for the first light strip 11, the second light strip 12, and the connecting board 13 all refer to an interval between closest sides of every two adjacent LEDs. In actual application, because each LED has the dimensions 3.5 mm×2.8 mm (commonly known as 3528 LED), this equal interval is preferably less than 3.5 mm, to obtain a uniformly emitting linear light source. The present invention is also applicable to a smaller LED and a larger reduced equal interval, and thus a more uniformly emitting linear light source can be obtained. In consideration of a mechanical error made during LED arrangement through the SMT and necessary spacing for electrical isolation of LED soldering pads, the equal interval is preferably set to be not less than 1 mm. On the other hand, if the LEDs after connection differ too much in height, uniformity of illumination may be affected. In order to avoid occurrence of this case, a thin PCB is used as the connecting board 13 preferably. By using the common 3528 LED described above as an example, the height of the LED is 1.3 mm, and therefore, the thickness of the PCB used for the connecting board 13 is preferably to be less than ¼ of the height of the LED or less than 0.3 mm, to obtain a connected linear light source that can uniformly emit light on the whole. In a preferred embodiment, an FPCB of which the thickness is less than 0.2 mm can be used as a PCB material for the connecting board 13. A thinner board creates more desirable uniformity of illumination.

In FIG. 3, based on the components shown in FIG. 1 and FIG. 2, the first light strip 11 and the second light strip 12 are first fixed (a fixing device is not shown) in position, and then the connecting board 13 are placed above a gap between the first light strip 11 and the second light strip 12. Pressure is applied on the four compression (thermo-compression) zones 77 on the front surface of the connecting board 13, to bond the connecting board 13 with the first light strip 11 and the second light strip 12 by the conductive adhesive in the bonding zones on the back surface of the connecting board 13. The bonding zones are further electrically connected. FIG. 3 shows a schematic side view of a whole body after assembly, where a bonding layer (conductive adhesive) 78 is the conductive adhesive. Moreover, in the embodiment shown in FIG. 3, the leftmost LED 20-31 on the front surface of the connecting board 13 and the rightmost LED 20-1 on the first light strip 11 are formed at the same pitch as the equal interval set for the first light strip 11; and the rightmost LED 20-32 on the front surface of the connecting board 13 and the leftmost LED 20-2 on the second light strip 12 are formed at the same pitch as the equal interval set for the first light strip 11. Because types and arrangements of the LEDs on the connecting board 13 are consistent with those of the LEDs on the first light strip 11 and the second light strip 12, an assembled LED light strip can be lengthened, and further, can still maintain a uniform illumination characteristic according to the present invention.

In the embodiment shown in FIG. 3, the connecting board 13 is connected to the first light strip 11 and the second light strip 12 by means of conductive adhesive (conductive adhesive) 78.

Figure 4D:
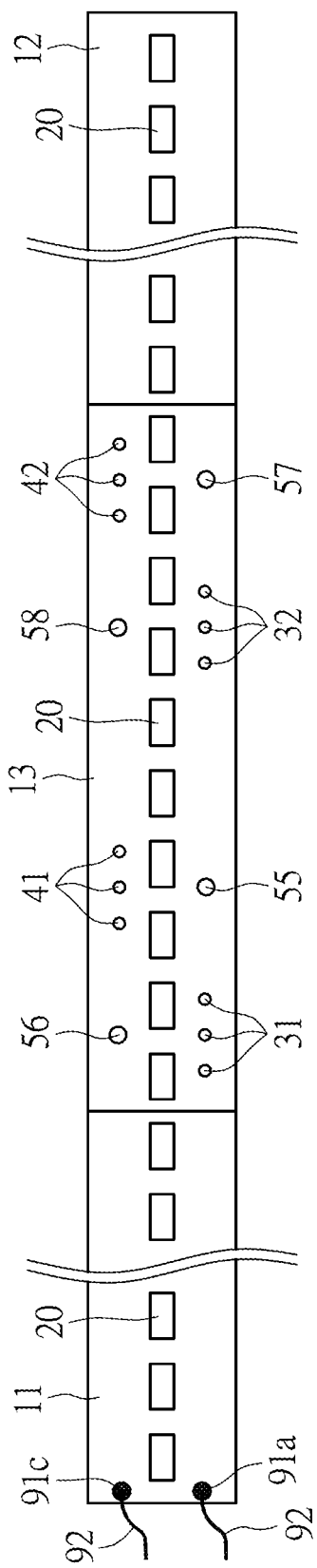
FIG. 4D is a schematic front view after assembly in the first embodiment of the present invention.

FIG. 4A to FIG. 4F show an implementation status of different components in another embodiment of the present invention. Further, FIG. 4A shows an embodiment of a connecting board 13. The connecting board in this embodiment is an FPCB with double-layer copper foil, and the thickness thereof is about 0.15 mm. The via holes are provided and shown on a front surface of the connecting board 13 in FIG. 4A. FIG. 4B shows a back surface of the connecting board. It should be noted that, the back surface is presented after the connecting board in FIG. 4A is turned over from left to right. Three third positive polarity via holes 31 are provided and shown on the front surface of the connecting board 13, and are all hollow holes around which a metal (copper) plating layer is provided on the hole wall. The third positive polarity via holes 31 run through the connecting board 13. That is to say, the third positive polarity bonding zone 73a1 on the back surface of the connecting board 13 is electrically connected to a power supply positive circuit (not shown in FIG. 4A to FIG. 4D) on the front surface of the connecting board 13 by means of electric conduction through the third positive polarity via holes 31. Three third negative polarity via holes 41 are further provided and shown on the front surface of the connecting board 13, and are all hollow holes around which a metal (copper) plating layer is provided on the hole wall.

The third negative polarity via holes 41 run through the connecting board 13, and pierce a third negative polarity bonding zone 73c1 of the connecting board 13. That is to say, the third negative polarity bonding zone 73c1 on the back surface of the connecting board 13 is electrically connected to a power supply negative circuit (not shown in FIG. 4A to FIG. 4D) on the front surface of the connecting board 13 by means of electric conduction through the third negative polarity via holes 41. Three fourth positive polarity via holes 32 are further provided and shown on the front surface of the connecting board 13, and are all hollow holes around which a metal (copper) plating layer is provided on the hole wall. The fourth positive polarity via holes 32 also run through the connecting board 13. That is to say, the fourth positive polarity bonding zone 73a2 on the back surface of the connecting board 13 is electrically connected to the power supply positive circuit (not shown in FIG. 4A to FIG. 4D) on the front surface of the connecting board 13 by means of electric conduction through the fourth positive polarity via holes 32. Three fourth negative polarity via holes 42 are further provided and shown on the front surface of the connecting board 13, and are all hollow holes around which a metal (copper) plating layer is provided on the hole wall. The fourth negative polarity via holes 42 also run through the connecting board 13. That is to say, the fourth negative polarity bonding zone 73c2 on the back surface of the connecting board 13 is electrically connected to the power supply negative circuit (not shown in FIG. 4A to FIG. 4D) on the front surface of the connecting board 13 by means of electric conduction through the fourth negative polarity via holes 42.

In addition to enabling electric connection of circuits on the upper layer and the lower layer (the front surface and the back surface) of the connecting board 13, the foregoing via holes also serve as interfaces for heat transfer. In the subsequent hot-bar soldering operation, the via holes transfer the heat from a heater tip, to melt solder on the first light strip 11 or the second light strip 12, such that the connecting board 13 is bonded with and electrically connected to the first light strip 11 or the second light strip 12. Four positioning holes 55, 56, 57, and 58 are provided on the connecting board 13 in FIG. 4A and FIG. 4B. The four positioning holes run through the connecting board 13, and are used to fix the connecting board during the connection or assembly process. The four positioning holes are a fifth positioning hole 55, a sixth positioning hole 56, a seventh positioning hole 57, and an eighth positioning hole 58.

FIG. 4C is a schematic diagram of another embodiment of the first light strip 11 and the second light strip 12 same as those in FIGS. 1 and 2. In addition to the plurality of equally spaced LEDs 20, the copper foil traces (not shown in FIG. 4C) connected to LED positive and negative leads, the positive contact 91a for power input, the negative contact 91c for power input, two external input power lines 92 to turn on the LEDs on the first light strip by the external input power, the first positive polarity bonding zone 71a, and the first negative polarity bonding zone 71c are provided on the first light strip 11. The first light strip 11 is further provided with two positioning holes 51 and 52 which are a first positioning hole 51 and a second positioning hole 52. These positioning holes run through the first light strip 11 and are used to fix the first light strip during connection or assembly process. In a subsequent operation of bonding the connecting board 13 and the first light strip 11, the first positioning hole 51 on the first light strip 11 is corresponding to the fifth positioning hole 55 on the connecting board 13, and the second positioning hole 52 on the first light strip 11 is corresponding to the sixth positioning hole 56 on the connecting board 13. Additionally, a metal layer (which is a tin alloy layer in this embodiment, and is created by printing the bonding zones with solder paste through SMT and a reflow process) with a low melting point is provided on both the first positive polarity bonding zone 71a and the first negative polarity bonding zone 71c, respectively. In addition to the plurality of equally spaced LEDs 20, the second positive polarity bonding zone 72a, and the second negative polarity bonding zone 72c, the second light strip 12 is further provided with two positioning holes 53 and 54 which are a third positioning hole 53 and a fourth positioning hole 54. These positioning holes run through the second light strip 12 and are used to fix the second light strip during connection or assembly process. In a subsequent operation of bonding the connecting board 13 and the second light strip 12, the third positioning hole 53 on the second light strip 12 is corresponding to the seventh positioning hole 57 on the connecting board 13, and the fourth positioning hole 54 on the second light strip 12 is corresponding to the eighth positioning hole 58 on the connecting board 13. Additionally, a metal layer (which is a tin alloy layer in this embodiment, and is created by printing the bonding zones with solder paste through SMT a reflow process) with a low melting point is provided on both the second positive polarity bonding zone 72a and the second negative polarity bonding zone 72c, respectively.

Figure 4E:
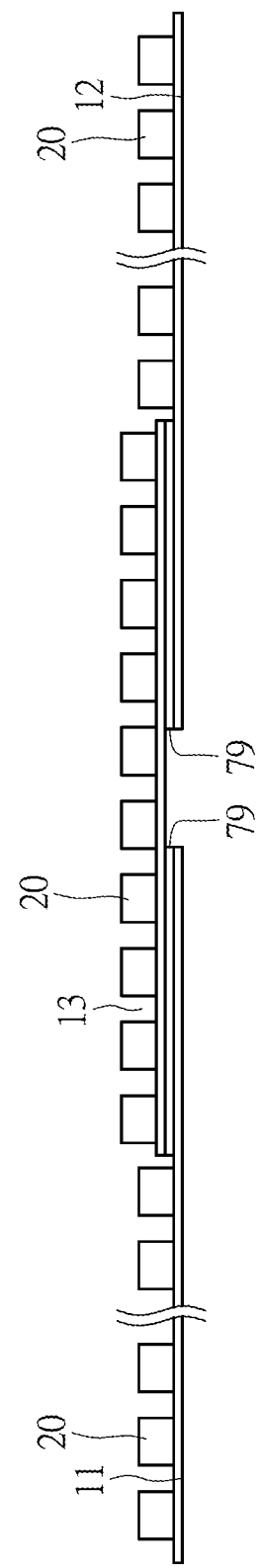
FIG. 4E is a schematic side view after assembly in the first embodiment of the present invention.

With reference to FIG. 4D and FIG. 4E, FIG. 4D is a schematic front view after assembly of the first light strip 11, the second light strip 12 and the connecting board 13, and FIG. 4E is a schematic side view after assembly of them, where a bonding layer (tin alloy) 79 is made from tin alloy. In the embodiment shown in FIGS. 4A, 4B and 4D, relative to the LEDs 20 provided on the front surface of the connecting board 13, the third positive polarity bonding zone 73a1 and the third negative polarity bonding zone 73c1 on the back surface of the connecting board 13 are respectively located below and above the row of the LEDs 20. That is, the third positive polarity via holes 31 and the third negative polarity via holes 41 shown on the front surface of the connecting board 13 are respectively distributed below and above the row of the LEDs 20.

Moreover, relative to the LEDs 20 provided on the front surface of the connecting board 13, the fourth positive polarity bonding zone 73a2 and the fourth negative polarity bonding zone 73c2 on the back surface of the connecting board 13 are respectively located below and above the row of the LEDs 20. That is, the fourth positive polarity via holes 32 and the fourth negative polarity via holes 42 shown on the front surface of the connecting board 13 are respectively distributed below and above the row of the LEDs 20.

Figure 4F:
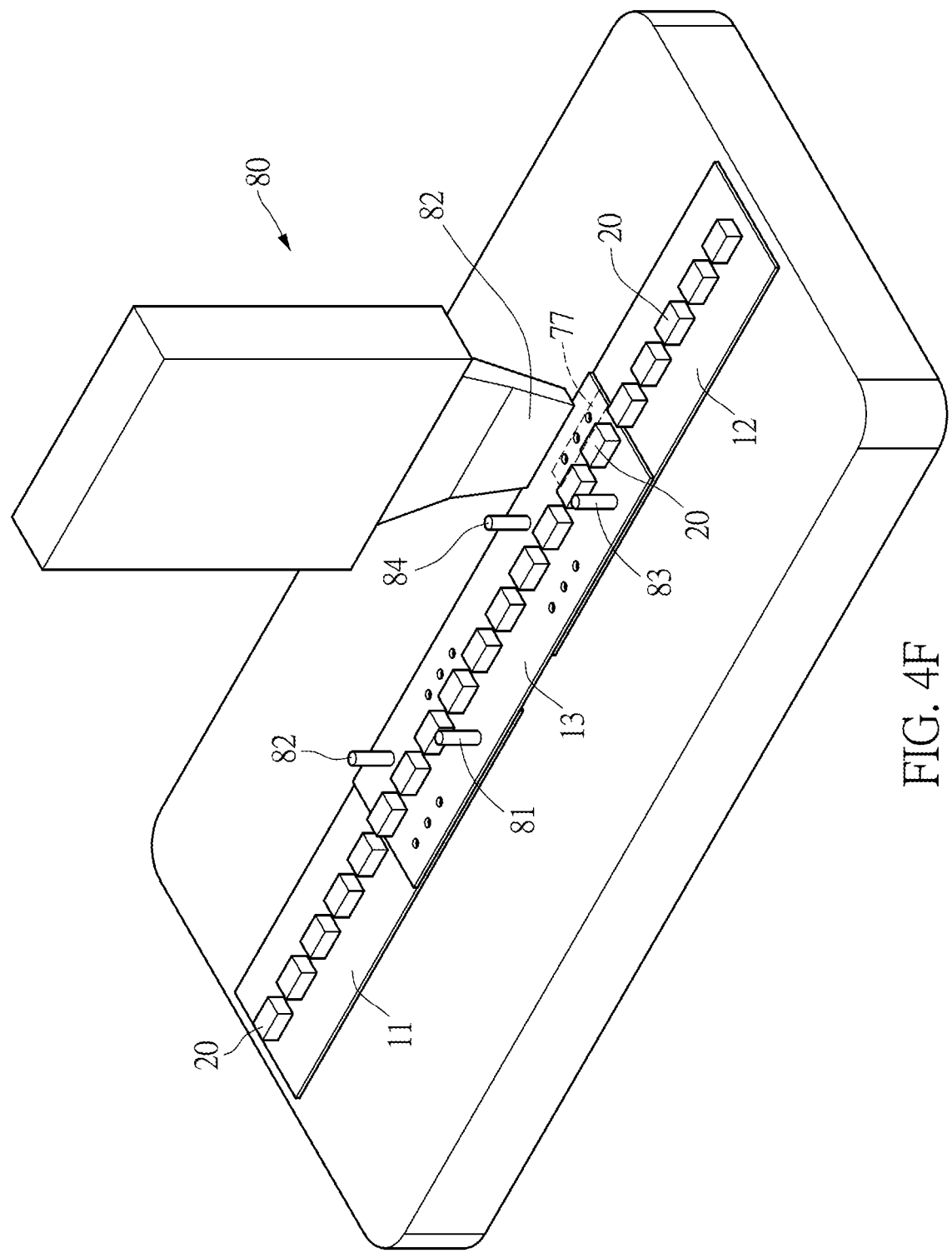
FIG. 4F is a schematic diagram showing that the first embodiment of the present invention is placed on a hot-bar soldering machine.
Figure 5D:
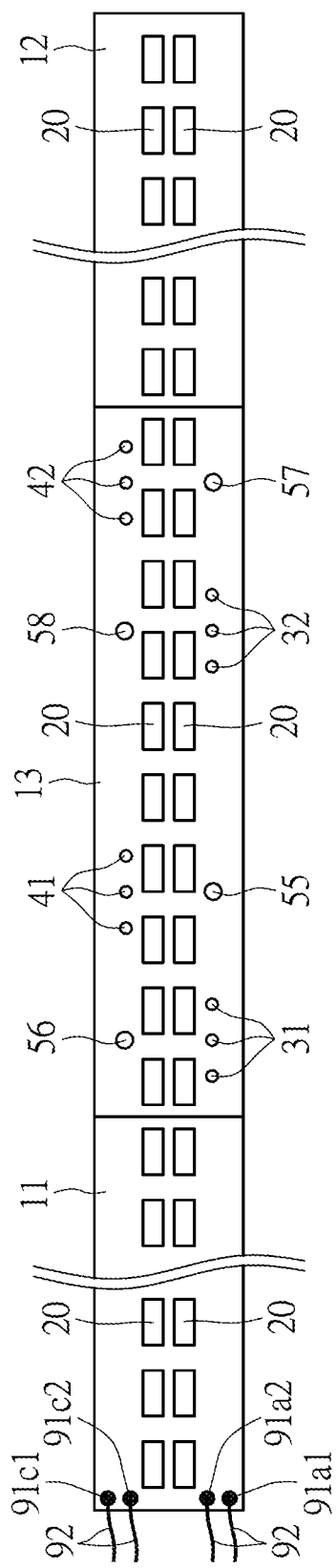
FIG. 5D is a schematic front view after assembly in the second embodiment of the present invention.
Figure 5E:
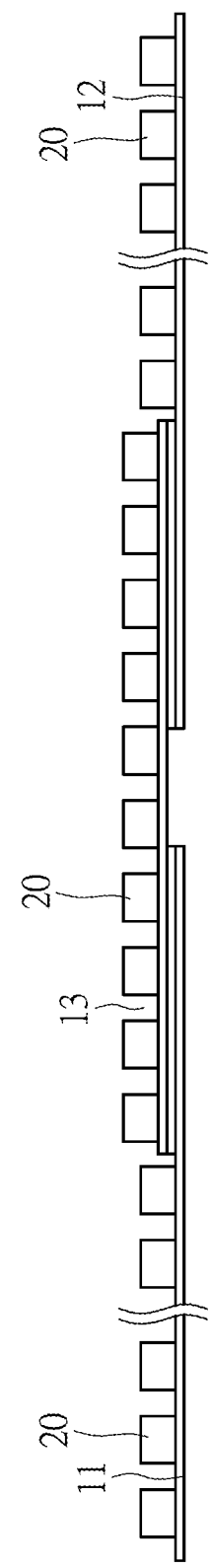
FIG. 5E is a schematic side view after assembly in the second embodiment of the present invention.

FIG. 4F is a schematic diagram showing that the first light strip 11, the second light strip 12, and the connecting board 13 are placed on a common hot-bar soldering machine 80 for a bonding operation (for connection or assembly process). The hot-bar soldering machine 80 is provided with four positioning columns which are a first positioning column 81, a second positioning column 82, a third positioning column 83, and a fourth positioning column 84. Positions and sizes of these positioning columns are respectively corresponding to the positions and sizes of the four positioning holes on the connecting board 13. First, the first light strip 11 is placed on the hot-bar soldering machine 80, and the first positioning hole 51 and the second positioning hole 52 on the first light strip 11 are passed through the first positioning column 81 and the second positioning column 82 on the hot-bar soldering machine 80 respectively. Then, the second light strip 12 is placed on the hot-bar soldering machine 80, and the third positioning hole 53 and the fourth positioning hole 54 on the second light strip 12 are passed through the third positioning column 83 and the fourth positioning column 84 on the hot-bar soldering machine 80 respectively. Finally, the connecting board 13 is placed above a gap between the first light strip 11 and the second light strip 12. Moreover, the first positioning column 81 is passed through the fifth positioning hole 55 on the connecting board 13, the second positioning column 82 is passed through the sixth positioning hole 56 on the connecting board 13, the third positioning column 83 is passed through the seventh positioning hole 57 on the connecting board 13, and the fourth positioning column 84 is passed through the eighth positioning hole 58 on the connecting board 13, thus ensuring bonding accuracy and the interval between the LEDs.

The hot-bar soldering machine described in FIG. 4F mainly uses heat produced by a heater tip 82 to melt a tin alloy layer (for example, a tin alloy layer separately printed on the polarity bonding zones of the first light strip 11 and the second light strip 12 in this embodiment, that is, the bonding layer (tin alloy) 79 made from tin alloy in the foregoing description) that is pre-printed on the first light strip 11 and the second light strip 12 through the SMT process. Then, the heated bonding layer (tin alloy) 79 is re-melted and then solidified, to electrically connect the connecting board and the light strips. Because the heater tip 82 of the hot-bar soldering machine is the only heat source, a thin FPCB is preferably selected for the connecting board 13 to achieve an optimal heat transfer effect and the best soldering quality.

In the embodiment shown in FIG. 4A to FIG. 4F, the connecting board 13 is connected to the first light strip 11 and the second light strip 12 through a hot-bar soldering process. By utilizing a tin alloy layer as the bonding layer (tin alloy) 79, the connecting board 13 is connected to the first light strip 11 and the second light strip 12 respectively through the hot-bar process. Additionally, electric circuit connection is enabled, such that the external input power can transmit power to the connecting board 13 and the second light strip 12 through the positive and negative contacts (91a and 91c) on the first light strip 11, to turn on the whole assembled LED light strip which still maintains the original characteristic of uniform illumination.

FIG. 5A to FIG. 5E are schematic implementation diagrams of different statuses in a second embodiment of the present invention. FIG. 5A to FIG. 5E are respectively corresponding to FIG. 4A to FIG. 4E in content. However, with reference to FIG. 5A to FIG. 5E, a difference between the second embodiment of the present invention and the first embodiment lies in that, arrangements of LEDs 20 on the first light strip 11, the second light strip 12 and the connecting board 13 in this embodiment differ from those in the first embodiment. The LEDs 20 shown in FIG. 4A to FIG. 4E are arranged in a single row, while the LEDs 20 shown in FIG. 5A to FIG. 5E are arranged in two rows. Specifically, in the two-row arrangement of the LEDs 20, the LEDs in the two rows may all be the same type in actual application, so as to enhance the luminous intensity of the light strips. Alternatively, in the two-row arrangement of the LEDs 20, the LEDs in the two rows may be two different types which emit light of two different colors. For example, yellow LEDs are linearly arranged in the upper row, and red LEDs are linearly arranged in the lower row. When the two rows of LEDs are designed to be turned on at different time, the light strip can produce yellow and red light, respectively. When the two rows of LEDs are designed to be turned on at the same time, the light strip can produce light of mixed colors of yellow and red. However, the colors are not limited in actual implementation of the present invention, and a user can make adjustment as required. In addition, the arrangement of the LEDs in actual application of the present invention is not limited to single-row arrangement or two-row arrangement, and a manufacturer can set three or four or more rows of LED light strips as required.

FIG. 6A to FIG. 6E are schematic diagrams of different statuses in a third embodiment of the present invention. With reference to FIG. 6A to FIG. 6E, differences between the third embodiment and the first embodiment shown in FIG. 4A to FIG. 4E are as follows: Relative to the LEDs 20 on the front surface of the connecting board 13, the third positive polarity bonding zone 73a1 and the third negative polarity bonding zone 73c1 on the back surface of the connecting board 13 are located at the same side of a row of the LEDs 20; and the fourth positive polarity bonding zone 73a2 and the fourth negative polarity bonding zone 73c2 on the back surface of the connecting board 13 are also located at the same side of the row of the LEDs 20.

Figure 6D:
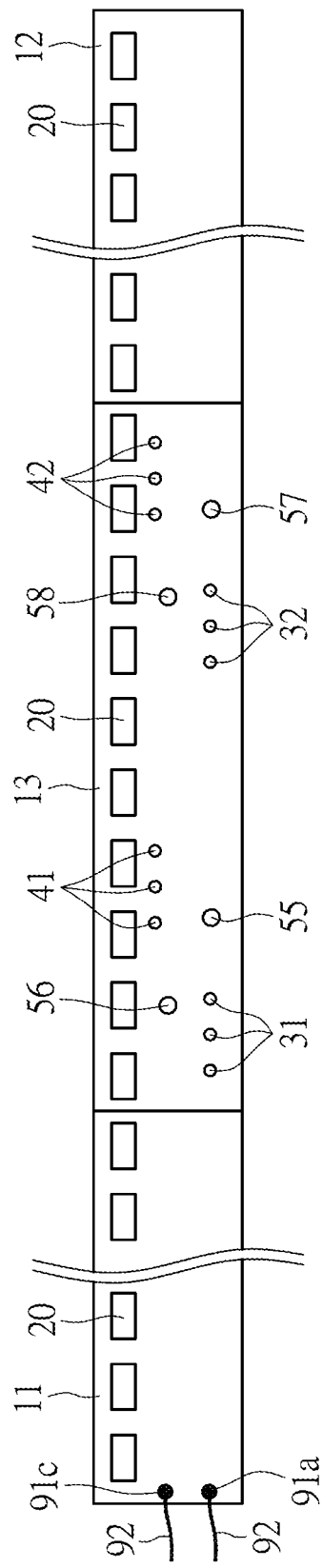
FIG. 6D is a schematic front view after assembly in the third embodiment of the present invention.
Figure 6E:
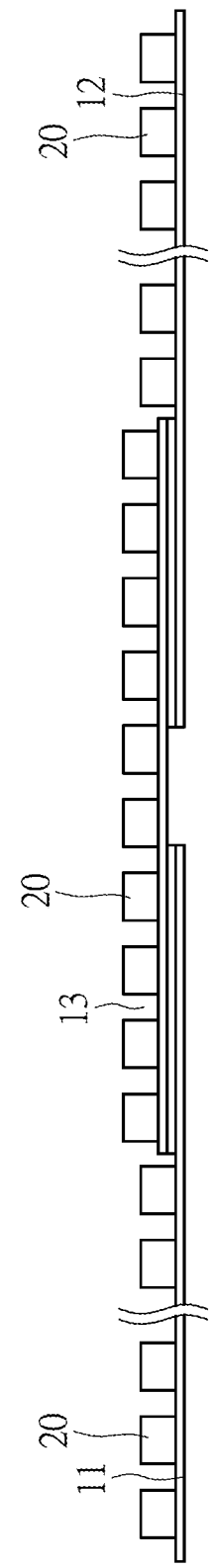
FIG. 6E is a schematic side view after assembly in the third embodiment of the present invention.

Specifically, the third positive polarity via holes 31 and the third negative polarity via holes 41 in FIG. 6A are distributed at the same side of the row of the LEDs 20, for example, below the row, as shown in FIG. 6A. Likewise, the fourth positive polarity via holes 32 and the fourth negative polarity via holes 42 are also distributed below the row of the LEDs 20. FIG. 6B shows a back surface that is presented after the connecting board 13 in FIG. 6A is turned over from left to right. Bonding zones and positioning holes marked from FIG. 6A to FIG. 6E are identical with those in the first embodiment.

FIG. 7A to FIG. 7E are schematic diagrams of different statuses in a fourth embodiment of the present invention, where FIG. 7B shows a back surface of the connecting board 13 that is presented after the connecting board 13 in FIG. 7A is turned over from left to right; FIG. 7C shows implementation statuses of front surfaces of the first light strip 11 and the second light strip 12; FIG. 7D is a schematic diagram of an implementation status after assembly of the first light strip 11, the second light strip 12, and the connecting board 13; and FIG. 7E is a schematic side view after assembly.

In the fourth embodiment shown in FIG. 7A to FIG. 7E, a difference between this embodiment and the first embodiment is as follows: An extended bonding sector 60 is extended from a side of the connecting board 13, and is used to provide bonding zones for positive or negative power input circuits or circuit signals, so as to connect multiple corresponding LED power lines or control lines on the LED light strips. As shown in FIG. 7A, the connecting board 13 appears like "T", and the extended bonding sector 60 is arranged on the lower side from the middle of the connecting board 13. When a large number of parallel-connected LED strings are required in design, positive and negative power lines of LED components also need to be increased in number. Alternatively, when a control signal line is additionally used to control different LEDs on the light strips to be turned on or off at different time or emit light of different brightness, the circuit line of control signal that on the first light strip 11 and the second light strip 12 also need to be connected through the connecting board 13. If bonding zones for the additionally disposed LED power lines or control lines cannot be provided due to limitation on the width of the first light strip 11 and the second light strip 12, a region extended from one side or both sides of a circuit board is used to provide the bonding zones for the LED power lines or control lines, so as to connect LED power lines and control signal lines between the first light strip 11 and the second light strip 12.

A plurality of electrical via holes and a plurality of bonding zones are provided at two sides of the extended bonding sector 60 of the connecting board 13 in FIG. 7A. In this embodiment, at each of left and right sides of the extended bonding sector 60 on the front surface of the connecting board 13, two control signal via holes 61, and three third positive polarity via holes 31 and three fourth positive polarity via holes 32 are provided. These via holes are separately connected to power lines or control signal lines or LED positive and negative soldering pads through different copper traces. A plurality of control signal bonding zones 74 and a plurality of positive polarity bonding zones 73a1 and 73a2 that are isolated from one another are provided at positions corresponding to the control signal via holes 61, the third positive polarity via holes 31, and the fourth positive polarity via holes 32 on the back surface of the connecting board 13, as shown in FIG. 7B. In this embodiment, same as the arrangement in the first embodiment, the connecting board 13 is also provided with three third negative polarity via holes 41 and their corresponding third negative polarity bonding zones 73c1 on the back surface, and three fourth negative polarity via holes 42 and their corresponding fourth negative polarity bonding zones 73c2 on the back surface. They are all formed above the row of a plurality of LEDs 20. Based on different circuit designs, in this embodiment, the positive polarity via holes and their corresponding positive polarity bonding zones on the back surface may be not limited by the arrangements shown in FIG. 7A and FIG. 7B, and the negative polarity via holes and their corresponding negative polarity bonding zones on the back surface may also be not limited by the arrangements shown in FIG. 7A and FIG. 7B. A plurality of positioning holes 50 are also provided on the connecting board 13. As shown in FIG. 7A to FIG. 7C, functions of these positioning holes 50 are same as those of the positioning holes described in the foregoing embodiments. Therefore, details are not described herein again to distinguish the different positioning holes.

In FIG. 7C, the first light strip 11 is additionally provided with two control signal access points 93 through which the first light strip can be connected to an external control signal source (not shown in FIG. 7C). A first extended bonding sector 63 is extended from one end of the first light strip 11 corresponding to the extended bonding sector 60 of the connecting board 13. The first positive polarity bonding zone 71a described in the first embodiment is provided on the first extended bonding sector 63 in this embodiment, and is connected to the positive contact 91a on the first light strip 11 through a copper trace. A plurality of control signal bonding zones 70 are also provided on the first extended bonding sector 63, and are connected to the control signal access points 93 on the first light strip 11 through the copper traces. In FIG. 7C, a second extended bonding sector 64 is extended from one end of the second light strip 12 corresponding to the extended bonding sector 60 of the connecting board 13. The second positive polarity bonding zone 72a described in the first embodiment is provided on the second extended bonding sector 64 in this embodiment. A plurality of control signal bonding zones 70 are provided on the second extended bonding sector 64. The connecting board 13 is bonded with the first light strip 11 and the second light strip 12 separately by conductive adhesive or a metal with a low melting point, as described above. The multiple control signal bonding zones 70 on the first light strip 11 and the second light strip 12 are connected via the control signal bonding zones 74 of the connecting board 13, to form a uniformly emitting linear LED light source assembly, which can transmit control signals from the first light strip 11 to the connecting board 13 and the second light strip 12 after assembly. FIG. 7D is a schematic diagram of a front surface of the uniformly emitting linear LED light source assembly after assembly, and FIG. 7E is a schematic side view of the uniformly emitting linear LED light source assembly after assembly.

Figure 8D:
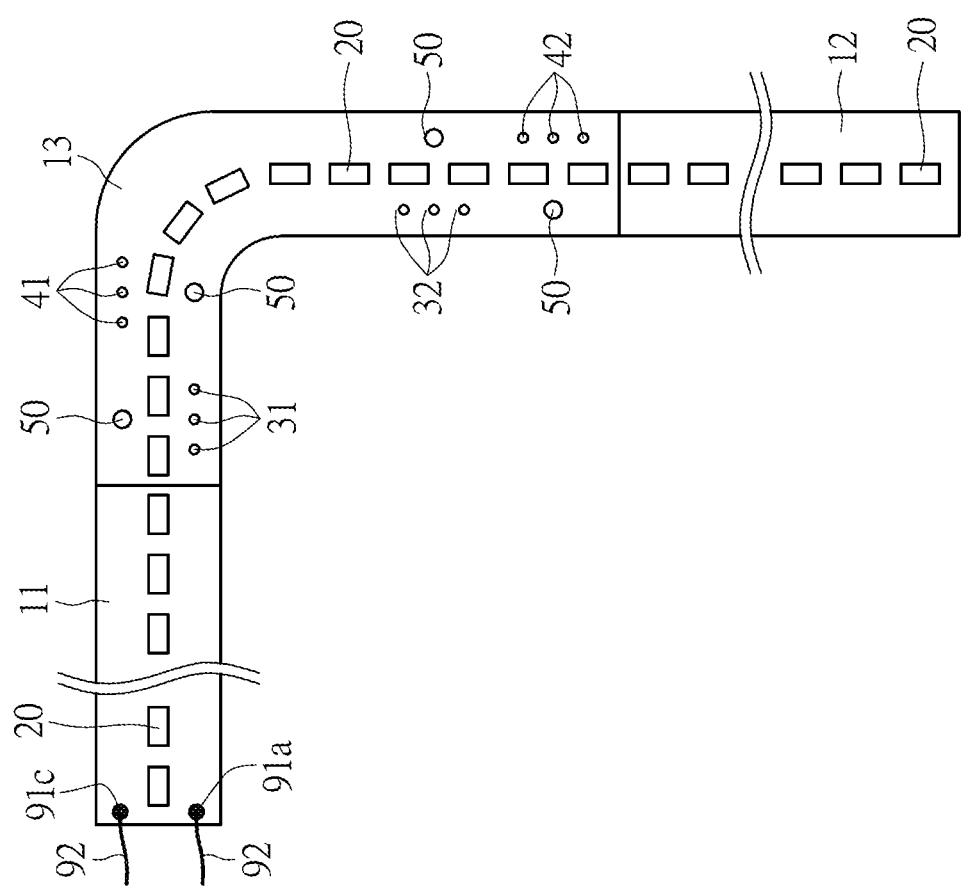
FIG. 8D is a schematic front view after assembly in the fifth embodiment of the present invention.

FIG. 8A to FIG. 8D are schematic implementation diagrams of a fifth embodiment of the present invention, where FIG. 8B shows a back surface of the connecting board 13, that is presented after the connecting board 13 in FIG. 8A is turned over from left to right. As shown from FIG. 8A to FIG. 8D, a difference between the fifth embodiment and the first embodiment lies in that, the connecting board 13 in the fifth embodiment is designed to be a curved shape (which resembles the shape of L in this embodiment). However, in actual application, the present invention is not limited to a curve at a right angle. A curved angle of any degree from 0° to 180° can be implemented by embodiments within the protection scope of the present invention. However, a first light strip 11 and a second light strip 12 in this embodiment are both kept straight. Same as the arrangement in the first embodiment, two ends of the connecting board 13 shaped like "L" are respectively bonded with the first light strip 11 and the second light strip 12. The upper end (as shown in FIG. 8A) of the connecting board 13 shaped like "L" is bonded with the first light strip 11 shown in FIG. 8C, and the lower end of the connecting board 13 shaped like "L" is bonded with the second light strip 12 shown in FIG. 8C. FIG. 8D shows an assembled structure of the three, which is a uniformly emitting linear light source shaped like "L" (or of a curved light source), and applicable to lamps related to streamlined automotive lighting. The first light strip 11 and the second light strip 12 used in this embodiment are both straight strips. Therefore, when a curved light strip is relatively long, the total cost of all required PCBs by the present invention is lower than that of using a single continuous curved PCB without connection, which wastes a lot of PCB materials to come out with a curved PCB.

Figure 9A:
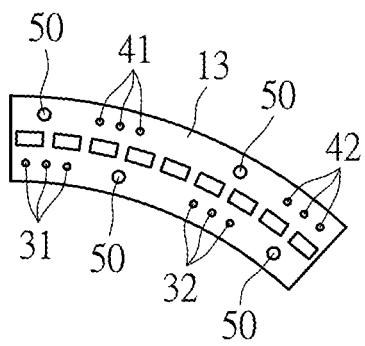
FIG. 9A is a schematic diagram of a front surface of a connecting board in a sixth embodiment of the present invention.
Figure 9B:
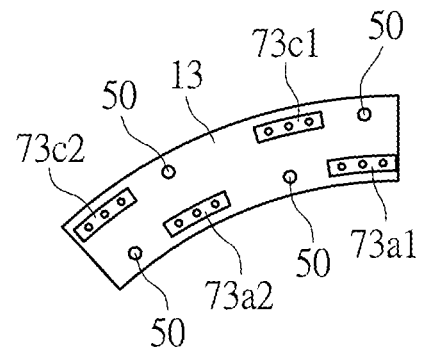
FIG. 9B is a schematic diagram of a back surface of the connecting board (which is turned over from left to right) in the sixth embodiment of the present invention.
Figure 9C:
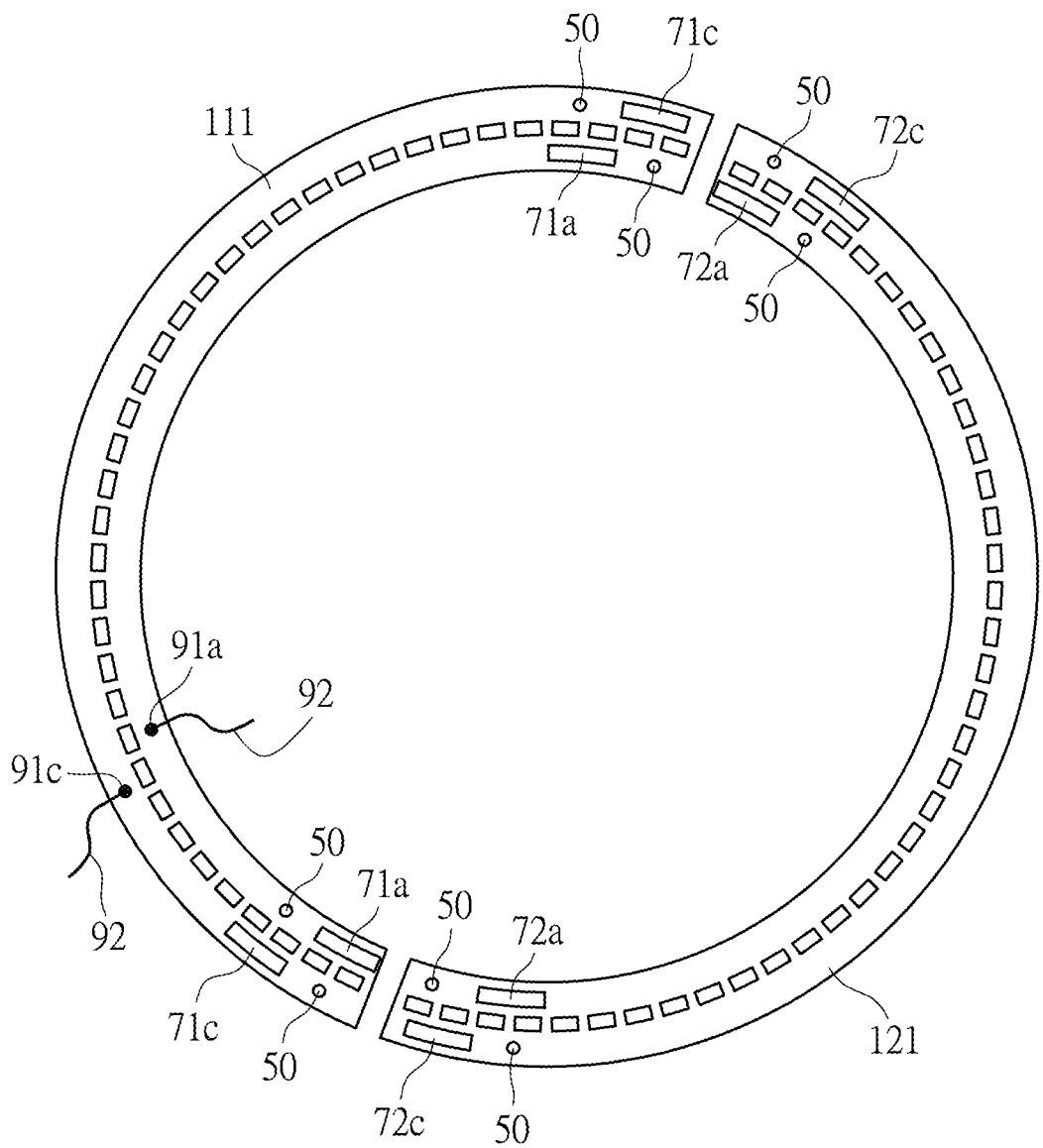
FIG. 9C is a schematic diagram of front surfaces of a first light strip and a second light strip in the sixth embodiment of the present invention.
Figure 9D:
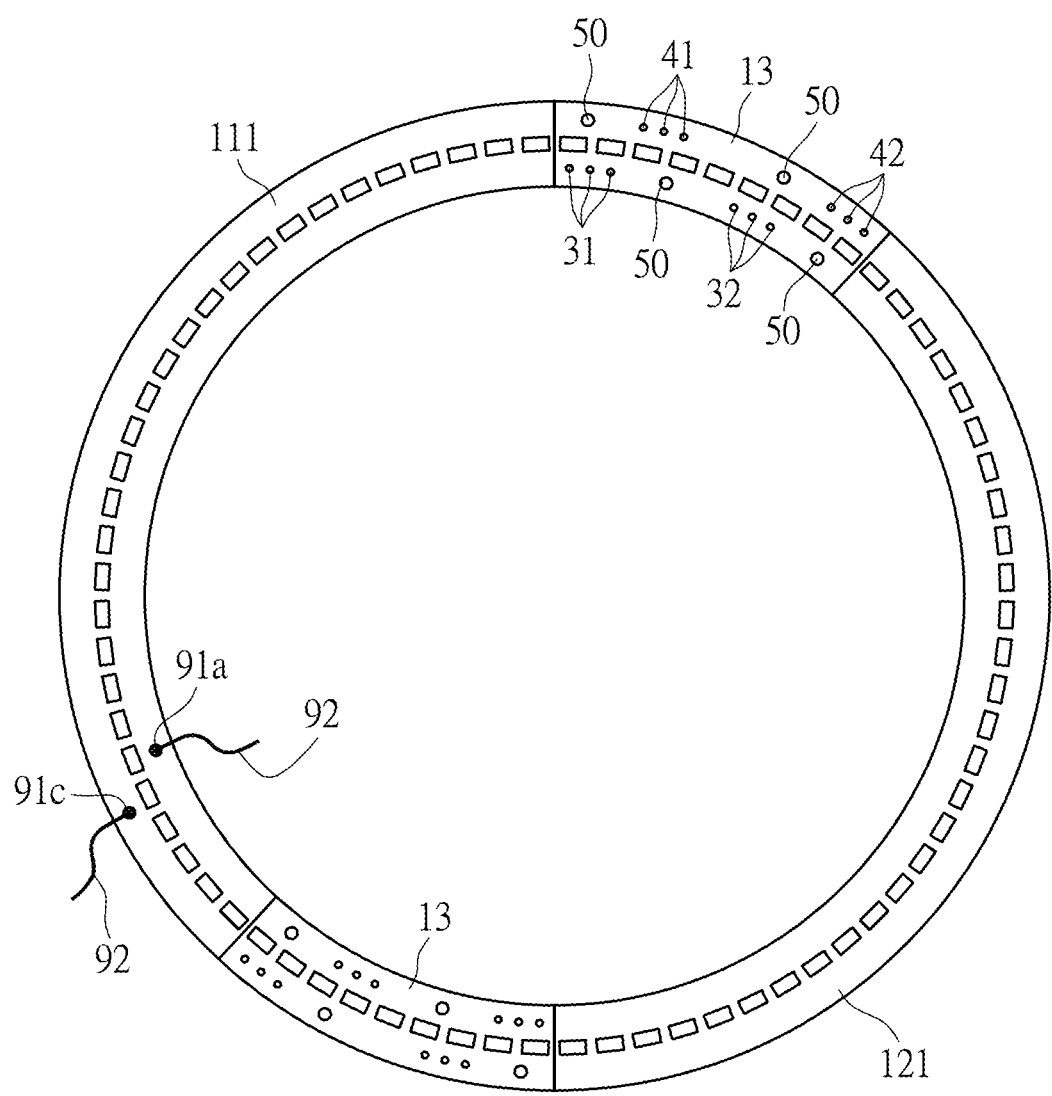
FIG. 9D is a schematic front view after assembly in the sixth embodiment of the present invention.

FIG. 9A to FIG. 9D are schematic implementation diagrams of a sixth embodiment of the present invention, where FIG. 9B shows a back surface of the connecting board 13 that is presented after the connecting board 13 in FIG. 9A is turned over from left to right. In addition, two connecting boards 13 are provided in the sixth embodiment. As shown from FIG. 9A to FIG. 9D, a difference between the sixth embodiment and the first embodiment lies in that, the two connecting boards 13 are both in the shape of an arc. Moreover, a first light strip 111 and a second light strip 121 in the sixth embodiment shown in FIG. 9C are also both in the shape of an arc. In addition to the different shapes, the first light strip 111 and the second light strip 121 differ from those in the first embodiment in that, each of two ends of the first light strip 111 is provided with a first positive polarity bonding zone 71a, a first negative polarity bonding zone 71c, and two positioning holes 50, and each of two ends of the second light strip 121 is provided with a second positive polarity bonding zone 72a, a second negative polarity bonding zone 72c, and two positioning holes 50. Two ends of one connecting board 13 are connected to the first light strip 111 and the second light strip 121 respectively, and two ends of another connecting board 13 are also connected to the second light strip 121 and the first light strip 111 respectively. FIG. 9D shows an assembled structure; where the first light strip 111, the second light strip 121, and the two connecting boards 13 are assembled to integrally form a ring-shaped uniformly emitting linear LED light source assembly. In this embodiment, the total cost of all used PCBs by the present invention is lower than that of using a single continuous circular PCB, which wastes lot of PCB materials.

Figure 10A:
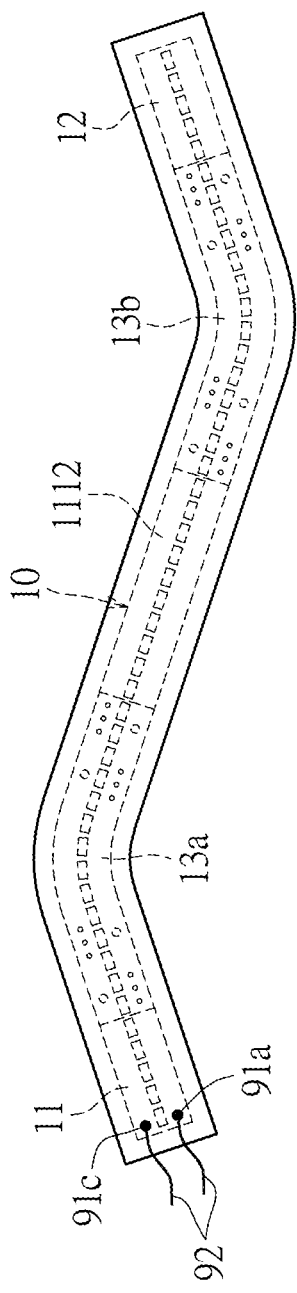
FIG. 10A is a schematic front view after assembly in a seventh embodiment of the present invention.
Figure 10B:
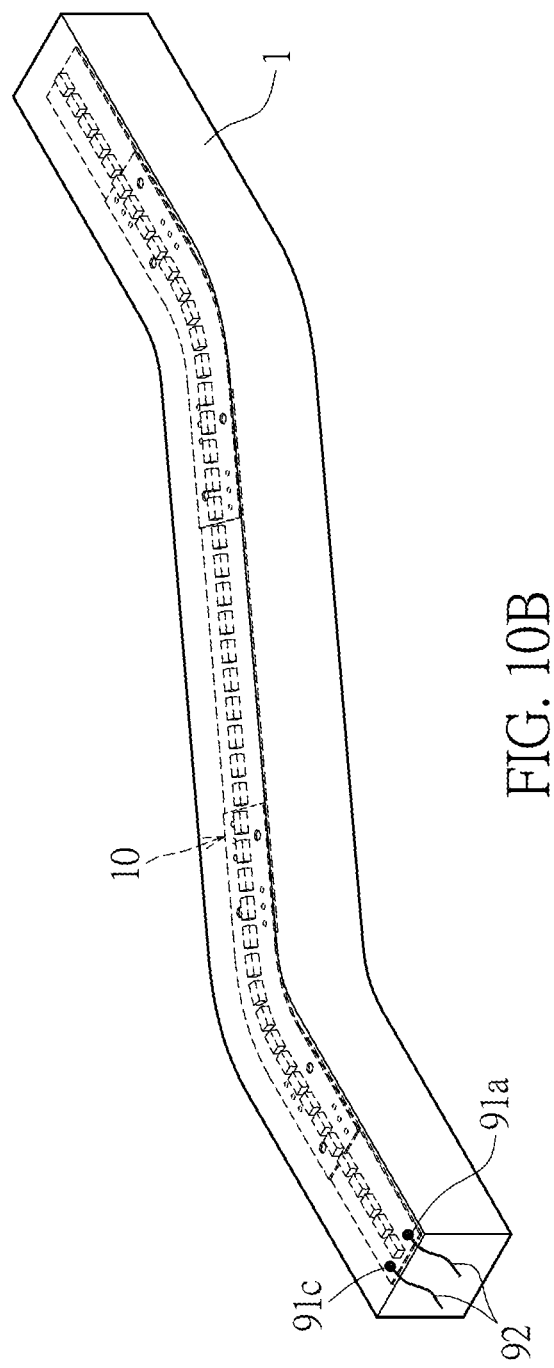
FIG. 10B is a schematic implementation diagram showing that the seventh embodiment of the present invention is mounted in a device.

FIG. 10A and FIG. 10B show an LED light strip 10 in a seventh embodiment of the present invention. A connecting board 13 for the LED light strip 10 in the seventh embodiment includes a first connecting board 13a and a second connecting board 13b that are both curved in FIG. 10 A. The seventh embodiment further provides two second light strips of different structures, in addition to one first light strip 11. One of the second light strips 12 has a structure same as that in the first embodiment. Another second light strip (also referred to as a bi-directional light strip) 1112 is provided with a plurality of LEDs that have the same type and arrangement as the LEDs on the first light strip 11. Moreover, the right end of the bi-directional light strip 1112 is provided with a positive polarity bonding zone, a negative polarity bonding zone, and positioning holes, which are consistent with those at the right end of the first light strip 11 as in the first embodiment. The left end of the bi-directional light strip 1112 is provided with a positive polarity bonding zone, a negative polarity bonding zone, and positioning holes, which are consistent with those at the left end of the second light strip 12 as in the first embodiment. Thus, the bi-directional light strip 1112 can be connected to the connecting board at both ends, which is the reason why the bi-directional light strip gets the name. Two ends of the first connecting board 13a are connected to the right end of the first light strip 11 and the left end of the bi-directional light strip 1112 respectively, and two ends of the second connecting board 13b are connected to the right end of the bi-directional light strip 1112 and the left end of the second light strip 12 respectively. The direction to which the second connecting board 13b is curved in connection is opposite to the direction to which the first connecting board 13a is curved. That is, as shown in FIG. 10A, the first connecting board 13a is curved downwards, while the second connecting board 13b is curved upwards. Thus, curved directions of the two connecting boards are opposite. After assembly, a streamlined LED light strip 10 curved like "S" is integrally formed, and a uniformly emitting linear LED light source assembly is implemented, which can be widely applied to modern streamlined automotive lighting. As shown in FIG. 10B, the LED light strip 10 shaped like "S" is mounted in a light-guide lamp, and then a streamlined uniformly-emitting LED automotive lighting device is presented, where the device is a curved streamlined LED automotive lighting device 1. If a diffusive plate is incorporated in a light-guide lamp or lamp cover is diffusive, the visual appearance of the above LED automotive lamp will be very uniform when all LEDs are turned on.

Figure 11:
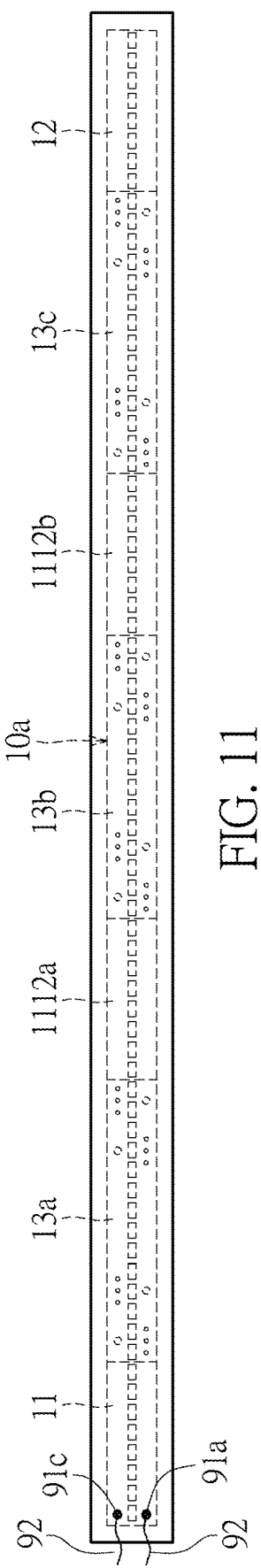
FIG. 11 is a schematic diagram of an extension embodiment in an eighth embodiment of the present invention.

FIG. 11 shows an eighth embodiment of the present invention, which is an extension embodiment of the foregoing seventh embodiment. This embodiment describes that the uniformly emitting linear LED light source assembly of the present invention can be randomly lengthened according to application requirements. In FIG. 11, the LED light source assembly includes a plurality of connecting boards 13, a first light strip 11, a second light strip 12, and a plurality of second light strips (bi-directional light strips) that each can be connected to the connecting board at both ends. In this embodiment shown in FIG. 11, only two bi-directional light strips are used as examples, which are a first bi-directional light strip 1112a and a second bi-directional light strip 1112b. The multiple connecting boards 13 (there are three connecting boards in this embodiment shown in FIG. 11) are a first connecting board 13a, a second connecting board 13b, and a third connecting board 13c. Two ends of the first connecting board 13a are respectively connected to the first light strip 11 and the first bi-directional light strip 1112a. Two ends of the second connecting board 13b are respectively connected to the first bi-directional light strip 1112a and the second bi-directional light strip 1112b. Two ends of the third connecting board 13c are respectively connected to the second bi-directional light strip 1112b and the second light strip 12. After assembly, a continuously extended linear light source is integrally formed, which is a linearly extended LED light strip 10a.

To sum up, the present invention provides a uniformly emitting linear LED light source assembly and a method thereof. By using a connecting board PCB provided with equally spaced LEDs as a connecting device, the LEDs on a connecting part are arranged in the same manner as those on linear light strips to be connected, thus ensuring uniformity of illumination of an assembled linear light source. Moreover, two or more light strips can be connected in the present invention, such that the length of a whole uniformly emitting light strip is not limited by the size of a commercially available PCB. Further, a high-brightness uniformly emitting LED light strip having closely arranged LEDs can also be connected in the present invention, and an interval between LEDs is not limited to be less than 3.5 mm or less, thus fully achieving novelty and progressiveness. The present invention can also effectively enhance the utilization of PCB materials for a curved LED light source, and can reduce the cost of required PCB materials. The present invention effectively overcomes the shortcomings of the prior art, and it is obvious that the present invention has the patent application requirements.

However, the description of the present invention is merely illustrative of preferred embodiments, and is not intended to limit the protection scope of the present invention. Any changes, modifications or additions still fall within the protection scope of the present invention.

What is claimed is:

1. A uniformly emitting linear light emitting diode (LED) light source assembly, comprising:
   a first light strip, provided with a plurality of LEDs arranged at equal intervals and copper foil traces on a printed circuit board (PCB), wherein the first light strip is provided with at least one positive contact for power input and at least one negative contact for power input, which are used to connect with an external input power; and at least one first positive polarity bonding zone and at least one first negative polarity bonding zone are disposed at a side of the first light strip;
   at least one second light strip, provided with a plurality of LEDs arranged at equal intervals and copper foil traces on a PCB, wherein the equal interval set for the second light strip is identical with that set for the first light strip, and at least one second positive polarity bonding zone and at least one second negative polarity bonding zone are disposed at a side of the second light strip toward the light strip to be connected; and
   at least one connecting board, which is a circuit board with at least two layers of copper foil, wherein a front surface thereof is provided with a plurality of LEDs arranged at equal intervals and copper foil traces, the equal interval set for the connecting board being identical with that set for the first light strip; a back surface thereof is provided with at least one third positive polarity bonding zone, at least one third negative polarity bonding zone, at least one fourth positive polarity bonding zone, and at least one fourth negative polarity bonding zone; at least one electrical via hole is provided in the third positive polarity bonding zone, such that the circuit on the back surface is connected to an upper-layer circuit of the connecting board, and the third positive polarity bonding zone is electrically bonded with the first positive polarity bonding zone on the first light strip; at least one electrical via hole is provided in the third negative polarity bonding zone, such that the circuit on the back surface is connected to the upper-layer circuit of the connecting board, and the third negative polarity bonding zone is electrically bonded with the first negative polarity bonding zone on the first light strip; at least one electrical via hole is provided in the fourth positive polarity bonding zone, such that the circuit on the back surface is connected to the upper-layer circuit of the connecting board, and the fourth positive polarity bonding zone is electrically bonded with the second positive polarity bonding zone on the second light strip; and at least one electrical via hole is provided in the fourth negative polarity bonding zone, such that the circuit on the back surface is connected to the upper-layer circuit of the connecting board, and the fourth negative polarity bonding zone is electrically bonded with the second negative polarity bonding zone on the second light strip;

wherein the connecting board connects the first light strip and the second light strip or connects two different second light strips; after connection, the LED closest to the first light strip on the connecting board and the LED closest to the connecting board on the first light strip are formed at the same pitch as the equal interval; and the LED closest to the second light strip on the connecting board and the LED closest to the connecting board on the second light strip are formed at the same pitch as the equal interval.

2. The uniformly emitting linear LED light source assembly of claim 1, wherein the LEDs on the connecting board, the first light strip, and the second light strip are all arranged in a single row.

3. The uniformly emitting linear LED light source assembly of claim 1, wherein the LEDs on the connecting board, the first light strip, and the second light strip are arranged in two or more rows.

4. The uniformly emitting linear LED light source assembly of claim 3, wherein in two or more rows of the LEDs on the connecting board, the first light strip, and the second light strip, the LEDs in each row emit the same or different colors.

5. The uniformly emitting linear LED light source assembly of claim 1, wherein relative to the LEDs provided on the front surface of the connecting board, the third positive polarity bonding zone and the third negative polarity bonding zone on the back surface of the connecting board are respectively located below and above a row of the LEDs; and the fourth positive polarity bonding zone and the fourth negative polarity bonding zone on the back surface of the connecting board are also respectively located below and above the row of the LEDs.

6. The uniformly emitting linear LED light source assembly of claim 1, wherein relative to the LEDs provided on the front surface of the connecting board, the third positive polarity bonding zone and the third negative polarity bonding zone on the back surface of the connecting board are located at the same side of a row of the LEDs; and the fourth positive polarity bonding zone and the fourth negative polarity bonding zone on the back surface of the connecting board are also located at the same side of the row of the LEDs.

7. The uniformly emitting linear LED light source assembly of claim 1, wherein
an extended bonding sector is extended from a side of the connecting board, the third positive or negative polarity bonding zone and the fourth positive or negative polarity bonding zone are provided on two sides of a back surface of the extended bonding sector respectively; a plurality of control signal access points are also provided on two sides of the back surface of the extended bonding sector, and at least one electrical via hole is provided in each of the control signal access points, such that the circuit on the back surface is connected to the upper-layer circuit of the connecting board;
a first extended bonding sector is extended from one end of the first light strip corresponding to the extended bonding sector, the first positive or negative polarity bonding zone is provided on the first extended bonding sector, and a plurality of control signal bonding zones are provided on the first extended bonding sector; and
a second extended bonding sector is extended from one end of the second light strip corresponding to the extended bonding sector, the second positive or negative polarity bonding zone is provided on the second extended bonding sector, and a plurality of control signal bonding zones are provided on the second extended bonding sector.

8. The uniformly emitting linear LED light source assembly of claim 1, wherein the connecting board, the first light strip, and the second light strip are all provided with at least one positioning hole, such that the LEDs on an assembled light strip are arranged at equal intervals.

9. The uniformly emitting linear LED light source assembly of claim 1, wherein conductive adhesive is disposed on all of the third positive and negative polarity bonding zones on the back surface of the connecting board or the first positive and negative polarity bonding zones on the first light strip, such that the connecting board can be bonded with and electrically connected to the first light strip by the conductive adhesive; and conductive adhesive is disposed on all of the fourth positive and negative polarity bonding zones on the back surface of the connecting board or the second positive and negative polarity bonding zones on the second light strip, such that the connecting board can be bonded with and electrically connected to the second light strip by the conductive adhesive.

10. The uniformly emitting linear LED light source assembly of claim 1, wherein the first positive and negative polarity bonding zones on the first light strip and the second positive and negative polarity bonding zones on the second light strip are each provided with a metal layer with a low melting point, such that they are respectively bonded with and electrically connected to the corresponding third positive and negative polarity bonding zones and fourth positive and negative polarity bonding zones on the back surface of the connecting board through a hot-bar process.

11. The uniformly emitting linear LED light source assembly of claim 1, wherein the connecting board is curved like "L", one end of the curved connecting board shaped like "L" is bonded with the first light strip, and the other end of the curved connecting board shaped like "L" is bonded with the second light strip, to integrally form a curved linear light source.

12. The uniformly emitting linear LED light source assembly of claim 1, wherein the connecting board comprises a first connecting board and a second connecting board which are both in the shape of an arc; the first light strip and the second light strip are also in the shape of an arc; each of two ends of the first light strip is provided with a first positive polarity bonding zone, a first negative polarity bonding zone, and at least one positioning hole; each of two ends of the second light strip is also provided with a second positive polarity bonding zone, a second negative polarity bonding zone, and at least one positioning hole; two ends of the first connecting board are connected to the first light strip and the second light strip respectively, and two ends of the second connecting board are connected to the second light strip and the first light strip respectively, to integrally form a ring-shaped light source.

13. The uniformly emitting linear LED light source assembly of claim 1, wherein a plurality of connecting boards, one first light strip, and a plurality of second light strips are provided, at least one of the second light strips being a bi-directional light strip; two ends of a first connecting board among these connecting boards are respectively connected to the first light strip and a first bi-directional light strip; and two ends of another connecting board are respectively connected to the other bi-directional light strip or the second light strip, to integrally form a continuously extended linear light source after assembly.

14. The uniformly emitting linear LED light source assembly of claim 13, wherein at least two of the connecting boards are curved and have opposite curved directions, such that an S-shaped streamlined light source is integrally formed after assembly.

15. The uniformly emitting linear LED light source assembly of claim 1, wherein the size of each LED on the first light strip, the second light strip, and the connecting board is preferably less than or equal to 3.5 mm in the linear arrangement direction.

16. The uniformly emitting linear LED light source assembly of claim 1, wherein the equal interval set for the first light strip refers to an interval between closest sides of every two adjacent LEDs, and is less than 3.5 mm.

17. The uniformly emitting linear LED light source assembly of claim 10, wherein the connecting board is a flexible PCB (FPCB) of which the thickness ranges from 0.1 mm to 0.3 mm.

* * * * *